US012316895B2

(12) United States Patent
Orlowski

(10) Patent No.: US 12,316,895 B2
(45) Date of Patent: *May 27, 2025

(54) DATA TRANSLATION FOR VIDEO-VIEWING ACTIVITY

(71) Applicant: Comcast Cable Communications, LLC, Philadelphia, PA (US)

(72) Inventor: Robert Alan Orlowski, Centennial, CO (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/173,180

(22) Filed: Feb. 23, 2023

(65) Prior Publication Data

US 2023/0283821 A1 Sep. 7, 2023

Related U.S. Application Data

(63) Continuation of application No. 14/037,352, filed on Sep. 25, 2013, now Pat. No. 11,627,356.

(51) Int. Cl.
*H04N 21/258* (2011.01)
*H03M 7/30* (2006.01)
*H04N 21/442* (2011.01)
*H04N 21/658* (2011.01)

(52) U.S. Cl.
CPC ........... *H04N 21/258* (2013.01); *H03M 7/30* (2013.01); *H04N 21/44222* (2013.01); *H04N 21/6582* (2013.01); *H04N 21/44226* (2020.08)

(58) Field of Classification Search
CPC .......... H04N 21/258; H04N 21/44222; H04N 21/6582; H04N 21/44226; H03M 7/30
See application file for complete search history.

(56) References Cited

U.S. PATENT DOCUMENTS

| 5,374,951 A | 12/1994 | Welsh |
| 5,589,892 A | 12/1996 | Knee et al. |
| 5,790,935 A | 8/1998 | Payton |

(Continued)

FOREIGN PATENT DOCUMENTS

| CN | 102236867 A | 11/2011 |
| EP | 1995878 A2 | 11/2008 |

(Continued)

OTHER PUBLICATIONS

U.S. Appl. No. 14/020,778, filed Sep. 6, 2013.

(Continued)

*Primary Examiner* — Jefferey F Harold
*Assistant Examiner* — Alexander Boyd
(74) *Attorney, Agent, or Firm* — Banner & Witcoff, Ltd.

(57) ABSTRACT

Methods, systems and apparatuses are described for using Linear, DVR, and VOD video viewing activity data for more efficient downstream processing to create analytical studies of second-by-second viewing activity for program, channel, house, device, viewer, demographic, and geographic attributes. Such attributes may be determined for one or more viewing devices. Attributes associated with different viewing devices may be replaced with a common substitute value. Video viewing metrics associated with a common substitute value may be determined.

35 Claims, 42 Drawing Sheets

(56) References Cited

U.S. PATENT DOCUMENTS

| | | |
|---|---|---|
| 5,872,588 A | 2/1999 | Aras et al. |
| 6,286,005 B1 | 9/2001 | Cannon |
| 6,449,350 B1 | 9/2002 | Cox |
| 6,820,277 B1 | 11/2004 | Eldering et al. |
| 7,383,243 B2 | 6/2008 | Conkwright et al. |
| 7,490,045 B1 | 2/2009 | Flores et al. |
| 7,509,663 B2 | 3/2009 | Maynard et al. |
| 7,590,993 B1 | 9/2009 | Hendricks et al. |
| 7,614,064 B2 | 11/2009 | Zigmond |
| 7,729,940 B2 | 6/2010 | Harvey et al. |
| 7,930,391 B1 | 4/2011 | Holt |
| 8,001,561 B2 | 8/2011 | Gibbs et al. |
| 8,079,054 B1 | 12/2011 | Dhawan et al. |
| 8,108,886 B1 | 1/2012 | Murahashi et al. |
| 8,214,867 B2 | 7/2012 | Hudspeth |
| 8,280,996 B2 | 10/2012 | Lu et al. |
| 8,351,645 B2 | 1/2013 | Srinivasan |
| 8,352,984 B2 | 1/2013 | Gogoi et al. |
| 8,365,212 B1 | 1/2013 | Orlowski |
| 8,365,213 B1 | 1/2013 | Orlowski |
| 8,453,173 B1 | 5/2013 | Anderson et al. |
| 8,548,991 B1 | 10/2013 | Zamir et al. |
| 8,682,137 B2 | 3/2014 | Wright et al. |
| 8,694,396 B1 | 4/2014 | Craner et al. |
| 8,739,197 B1 | 5/2014 | Pecjak et al. |
| 8,745,647 B1 | 6/2014 | Shin et al. |
| 8,924,993 B1 | 12/2014 | Niebles Duque et al. |
| 8,949,873 B1 | 2/2015 | Bayer et al. |
| 8,959,540 B1 | 2/2015 | Gargi et al. |
| 9,277,275 B1 | 3/2016 | Arini |
| 9,363,464 B2 | 6/2016 | Alexander |
| 9,420,320 B2 | 8/2016 | Doe |
| 9,794,360 B1 | 10/2017 | Farhangi et al. |
| 9,854,292 B1 | 12/2017 | Matthews et al. |
| 9,883,233 B1 | 1/2018 | Barton |
| 10,070,177 B1 | 9/2018 | Gupta |
| 10,089,592 B2 | 10/2018 | Orlowski |
| 10,440,428 B2 | 10/2019 | Orlowski |
| 10,645,433 B1 | 5/2020 | Orlowski |
| 10,779,042 B1 | 9/2020 | Gupta et al. |
| 10,945,011 B2 | 3/2021 | Orlowski |
| 11,012,726 B2 | 5/2021 | Orlowski |
| 11,212,565 B2 | 12/2021 | Orlowski |
| 11,218,755 B2 | 1/2022 | Orlowski |
| 11,240,539 B2 | 2/2022 | Joshi et al. |
| 11,265,602 B2 | 3/2022 | Malhotra et al. |
| 11,363,331 B2 | 6/2022 | Orlowski |
| 11,537,971 B2 | 12/2022 | Orlowski |
| 11,627,356 B2 | 4/2023 | Orlowski |
| 11,671,638 B2 | 6/2023 | Orlowski |
| 11,677,998 B2 | 6/2023 | Orlowski |
| 2002/0055854 A1 | 5/2002 | Kurauchi et al. |
| 2002/0056087 A1 | 5/2002 | Berezowski et al. |
| 2002/0059576 A1 | 5/2002 | Feininger et al. |
| 2002/0062393 A1 | 5/2002 | Borger et al. |
| 2002/0083451 A1 | 6/2002 | Gill et al. |
| 2002/0104083 A1 | 8/2002 | Hendricks et al. |
| 2002/0129368 A1 | 9/2002 | Schlack et al. |
| 2002/0144262 A1 | 10/2002 | Plotnick et al. |
| 2002/0194196 A1 | 12/2002 | Weinberg et al. |
| 2003/0020744 A1 | 1/2003 | Ellis et al. |
| 2003/0046696 A1 | 3/2003 | Mizuno et al. |
| 2003/0088715 A1 | 5/2003 | Chaudhuri et al. |
| 2003/0115585 A1 | 6/2003 | Barsness et al. |
| 2003/0145323 A1 | 7/2003 | Hendricks et al. |
| 2003/0149988 A1 | 8/2003 | Ellis et al. |
| 2003/0172374 A1 | 9/2003 | Vinson et al. |
| 2003/0174160 A1 | 9/2003 | Deutscher et al. |
| 2003/0237095 A1 | 12/2003 | Srinivas |
| 2004/0019899 A1 | 1/2004 | Pelletier |
| 2004/0215698 A1 | 10/2004 | Bertin |
| 2004/0268226 A1 | 12/2004 | McMullin |
| 2005/0060745 A1 | 3/2005 | Riedl et al. |
| 2005/0086110 A1 | 4/2005 | Haley et al. |
| 2005/0149964 A1 | 7/2005 | Thomas et al. |
| 2005/0204387 A1 | 9/2005 | Knudson et al. |
| 2005/0229199 A1 | 10/2005 | Yabe |
| 2005/0235307 A1 | 10/2005 | Relan et al. |
| 2005/0286860 A1 | 12/2005 | Conklin |
| 2006/0015891 A1 | 1/2006 | Lazzaro et al. |
| 2006/0075420 A1 | 4/2006 | Ludvig et al. |
| 2006/0075421 A1 | 4/2006 | Roberts et al. |
| 2006/0168609 A1 | 7/2006 | Chen |
| 2006/0184961 A1 | 8/2006 | Lee et al. |
| 2006/0198302 A1 | 9/2006 | Sofman et al. |
| 2006/0223495 A1 | 10/2006 | Cassett et al. |
| 2007/0067794 A1 | 3/2007 | Russell et al. |
| 2007/0074258 A1 | 3/2007 | Wood et al. |
| 2007/0092204 A1 | 4/2007 | Wagner et al. |
| 2007/0124756 A1 | 5/2007 | Covell et al. |
| 2007/0136753 A1 | 6/2007 | Bovenschulte et al. |
| 2007/0157249 A1 | 7/2007 | Cordray et al. |
| 2007/0157260 A1 | 7/2007 | Walker |
| 2007/0186228 A1 | 8/2007 | Ramaswamy et al. |
| 2007/0214483 A1 | 9/2007 | Bou-Abboud |
| 2007/0271300 A1 | 11/2007 | Ramaswamy |
| 2007/0283409 A1 | 12/2007 | Golden |
| 2007/0288950 A1 | 12/2007 | Downey et al. |
| 2008/0022300 A1* | 1/2008 | Angiolillo ............ H04N 21/812 |
| | | 348/E7.071 |
| 2008/0046912 A1 | 2/2008 | Gemelos et al. |
| 2008/0077951 A1 | 3/2008 | Maggio et al. |
| 2008/0126420 A1 | 5/2008 | Wright et al. |
| 2008/0127252 A1 | 5/2008 | Eldering et al. |
| 2008/0250453 A1 | 10/2008 | Smith et al. |
| 2008/0300965 A1 | 12/2008 | Doe |
| 2009/0007171 A1 | 1/2009 | Casey et al. |
| 2009/0046994 A1 | 2/2009 | Takesue et al. |
| 2009/0052864 A1 | 2/2009 | Ohde |
| 2009/0070798 A1 | 3/2009 | Lee et al. |
| 2009/0077577 A1 | 3/2009 | Allegrezza et al. |
| 2009/0077579 A1 | 3/2009 | Li et al. |
| 2009/0094630 A1 | 4/2009 | Brown |
| 2009/0100456 A1 | 4/2009 | Hughes |
| 2009/0133047 A1 | 5/2009 | Lee et al. |
| 2009/0133073 A1* | 5/2009 | DaLaCruz ......... H04N 21/8173 |
| | | 725/49 |
| 2009/0150224 A1 | 6/2009 | Lu et al. |
| 2009/0150814 A1 | 6/2009 | Eyer et al. |
| 2009/0172725 A1 | 7/2009 | Heilbron et al. |
| 2009/0183210 A1 | 7/2009 | Andrade |
| 2009/0193460 A1 | 7/2009 | Barnett |
| 2009/0268905 A1 | 10/2009 | Matsushima et al. |
| 2009/0313232 A1 | 12/2009 | Tinsley et al. |
| 2009/0327208 A1 | 12/2009 | Bittner et al. |
| 2010/0043021 A1 | 2/2010 | Torsiello et al. |
| 2010/0088716 A1 | 4/2010 | Ellanti et al. |
| 2010/0115060 A1 | 5/2010 | Julia et al. |
| 2010/0145791 A1 | 6/2010 | Canning et al. |
| 2010/0161492 A1 | 6/2010 | Harvey et al. |
| 2010/0169911 A1 | 7/2010 | Zhang |
| 2010/0191689 A1 | 7/2010 | Cortes et al. |
| 2010/0211439 A1 | 8/2010 | Marci et al. |
| 2010/0235852 A1 | 9/2010 | Mears |
| 2010/0251302 A1 | 9/2010 | Chao et al. |
| 2010/0262986 A1 | 10/2010 | Adimatyam et al. |
| 2010/0330954 A1 | 12/2010 | Manning Cassett et al. |
| 2011/0029666 A1 | 2/2011 | Lopatecki et al. |
| 2011/0069940 A1 | 3/2011 | Shimy et al. |
| 2011/0072448 A1 | 3/2011 | Stiers et al. |
| 2011/0110515 A1 | 5/2011 | Tidwell et al. |
| 2011/0126241 A1 | 5/2011 | Beattie, Jr. et al. |
| 2011/0145847 A1 | 6/2011 | Barve et al. |
| 2011/0289524 A1 | 11/2011 | Toner et al. |
| 2011/0307913 A1 | 12/2011 | Wang et al. |
| 2011/0321077 A1 | 12/2011 | Wang et al. |
| 2012/0005527 A1 | 1/2012 | Engel et al. |
| 2012/0079518 A1 | 3/2012 | Wan et al. |
| 2012/0151511 A1 | 6/2012 | Bernard et al. |
| 2012/0191815 A1 | 7/2012 | Tabbal et al. |
| 2012/0222058 A1 | 8/2012 | el Kaliouby et al. |
| 2012/0240143 A1 | 9/2012 | Mathews |
| 2012/0254911 A1 | 10/2012 | Doe |
| 2012/0260278 A1 | 10/2012 | Lambert et al. |

(56) References Cited

U.S. PATENT DOCUMENTS

| | | |
|---|---|---|
| 2012/0278161 A1 | 11/2012 | Lazzaro |
| 2012/0278179 A1 | 11/2012 | Campbell et al. |
| 2012/0278828 A1 | 11/2012 | Yazdani et al. |
| 2012/0296909 A1 | 11/2012 | Cao et al. |
| 2012/0304210 A1 | 11/2012 | Zaslavsky et al. |
| 2012/0304211 A1 | 11/2012 | Berezowski et al. |
| 2013/0007789 A1 | 1/2013 | Wang et al. |
| 2013/0024901 A1 | 1/2013 | Sharif-Ahmadi et al. |
| 2013/0124309 A1 | 5/2013 | Traasdahl et al. |
| 2013/0145385 A1 | 6/2013 | Aghajanyan et al. |
| 2013/0173765 A1 | 7/2013 | Korbecki |
| 2013/0198125 A1 | 8/2013 | Oliver et al. |
| 2013/0247081 A1 | 9/2013 | Vinson et al. |
| 2013/0254787 A1 | 9/2013 | Cox et al. |
| 2013/0283304 A1 | 10/2013 | Wan et al. |
| 2013/0346154 A1 | 12/2013 | Holz et al. |
| 2014/0075465 A1 | 3/2014 | Petrovic et al. |
| 2014/0109124 A1 | 4/2014 | Morales et al. |
| 2014/0123173 A1 | 5/2014 | Mak et al. |
| 2014/0150005 A1 | 5/2014 | Kalmes et al. |
| 2014/0181019 A1 | 6/2014 | Bajaria et al. |
| 2014/0351835 A1 | 11/2014 | Orlowski |
| 2014/0359649 A1 | 12/2014 | Cronk et al. |
| 2015/0113153 A1 | 4/2015 | Lin |
| 2015/0128162 A1 | 5/2015 | Ionescu |
| 2016/0261655 A1 | 9/2016 | Aggarwal et al. |
| 2016/0314404 A1 | 10/2016 | Carmichael et al. |
| 2017/0289226 A1 | 10/2017 | Deshpande et al. |
| 2018/0007431 A1 | 1/2018 | Sidhu et al. |
| 2019/0058917 A1 | 2/2019 | Orlowski |
| 2019/0305978 A1 | 10/2019 | Ramirez et al. |
| 2019/0378164 A1 | 12/2019 | Eich et al. |
| 2019/0379938 A1 | 12/2019 | Salo et al. |
| 2020/0162774 A1 | 5/2020 | Galuten |
| 2020/0296456 A1 | 9/2020 | Yungster |
| 2021/0058670 A1 | 2/2021 | Benamrouche |
| 2021/0158391 A1 | 5/2021 | Sheppard et al. |
| 2021/0240681 A1 | 8/2021 | Algranati et al. |
| 2022/0084052 A1 | 3/2022 | Sheppard et al. |
| 2022/0150581 A1 | 5/2022 | Sidhu et al. |
| 2022/0159326 A1 | 5/2022 | Sheppard et al. |
| 2022/0182722 A1 | 6/2022 | Bolivar et al. |
| 2022/0256219 A1 | 8/2022 | Saafi |
| 2022/0286722 A1 | 9/2022 | Milavsky et al. |
| 2022/0303618 A1 | 9/2022 | Whitely et al. |
| 2022/0383350 A1 | 12/2022 | Keshavan et al. |

FOREIGN PATENT DOCUMENTS

| | | |
|---|---|---|
| WO | 98/31114 A1 | 7/1998 |
| WO | 2012162693 A1 | 11/2012 |
| WO | 2013033123 A2 | 3/2013 |

OTHER PUBLICATIONS

U.S. Appl. No. 14/608,929, filed Jan. 29, 2015.
U.S. Appl. No. 14/608,960, filed Jan. 29, 2015.
U.S. Appl. No. 17/662,149, filed May 5, 2022.
U.S. Appl. No. 17/984,036, filed Nov. 9, 2022.
U.S. Appl. No. 18/135,565, filed Apr. 17, 2023.
U.S. Appl. No. 18/138,590, filed Apr. 24, 2023.
Tim Brooks, Stu Gray, Jim Dennison, "The State Of Set-Top Box Viewing Data as of Dec. 2009", STB Committee of the Council for Research Excellence. Research Report, Feb. 24, 2010, http://researchexcellence.com/stbstudy.php, pp. 1-9.
FourthWall Media, Product information from web page, MassiveDataTM, http://www.fourthwallmedia.tv, Oct. 18, 2013, p. 1.
Cisco Systems, Inc., "Channel Viewership Analyzer", 2009, Web page: http://www.cisco.com/en/US/prod/collateral/video/ps9119/ps9883/7016867.pdf, pp. 1-2.
Ineoquest Technologies, Inc., "Switched Digital Video Solutions", http://www.ineoquest.com/switched-digital-video-solutions, Dec. 28, 2010, pp. 1-2.
Motorola, Inc., Solutions Paper, "Implementing Switched Digital Video Solutions", http://www.motorola.com/staticfiles/Business/Products/_Documents/_Static%20files/SDV%20Implementation%20Solutions%20paper%20-555998-001-a.pdf?localeId=33, Copyright 2008, p. 6.
Strickland, Jonathan, "How Switched Digital Video Works", Nov. 20, 2007. HowStuffWorks.com. <http://electronics.howstuffworks.com/switched-digital-video.htm>, pp. 1-4.
Rentrak Corporation, Television, TV Essentials, Web source: http://www.rentrak.com/section/media/tv/linear.html, Feb. 1, 2011, p. 1.
Wayne Friedman, Rentrak's 'Stickiness' Mines TV Value On Granular Level , MediaPost, Jan. 27, 2010, Web source: http://www.tvb.org/media/file/TVB_Measurement_Rentraks_Stickiness_Mines_TV_Value_on_Granular_Level_1-27-10.pdf.
Rentrak Corporation, Reaching Your Target Audience Using Viewership Segments, Rentrak Case Studies, http://rentrak.com/downloads/Viewership_Segment_Case_Study.pdf, Oct. 18, 2013, p. 1-2.
Rentrak Corporation, Reaching Your Target Audience Using Commercial Ratings and Pod Analysis, Rentrak Case Studies, http://www.rentrak.com/downloads/Commercial_and_Pod_Analysis_Case_Study.pdf, Oct. 18, 2013, p. 1-2.
Rentrak Corporation, Rentrak Overview: Exact Commercial Ratings®, http://www.rentrak.com/downloads/Exact_Commercial_Ratings_Presentation.pdf, Jan. 22, 2013, p. 1-30.
Cisco Systems, Inc., "Network Efficiency with Switched Digital", Web page: http://www.cisco.com/en/US/products/ps9258/index.html, accessed Oct. 13, 2014, 2 pages.
Cisco Systems, Inc., "Access Viewership Data, Monitor Performance", Web page: http://www.cisco.com/en/US/products/ps9122/index.html, accessed May 20, 2013, 1 page.
Extended European Search Report—EP 14183827.6—Mailing date: Oct. 23, 2014.
Extended European Search Report—EP 14182927.5—Mailing date: Dec. 16, 2014.
Terry A. Welch, Sperry Research Center, "A Technique for High-Performance Data Compression," 1984.
Extended European Search Report, EP Application 14186382.9, Dated February Feb. 4, 2015.
Response to European Search Report—EP Appl. 14182927.5—submitted Sep. 4, 2015.
Response to European Search Report—EP 14183827.6—Dated Sep. 10, 2015.
Response to EP Search Report—EP 14186382.9—Dated Sep. 29, 2015.
EP Office Action—EP App 14182927.5—Mailed Mar. 31, 2016.
Konstantin Shvachko et al.: "The Hadoop Distributed File System", Mass Storage Systems and Technologies (MSST), 2010 IEEE 26th Symposium On, IEEE, Piscataway, NJ, USA, May 3, 2010 (May 3, 2010), pp. 1-10, XP031698650, ISBN: 978-1-4244-7152-2.
Anonymous: "Apache Hadoop", Sep. 5, 2013 (Sep. 5, 2013), XP055394634, Retrieved from the Internet: URL: https://en.wikipedia.org/w/index.php?title=Apache_Hadoop&oldid=571641303 [retrieved on Jul. 28, 2017].
Aug. 4, 2017—(EP) Office Action—App No. 14183827.6.
May 22, 2018—European Office Action—EP 14183827.6.
Mark Landler, Digital TV Converter Boxes to Expand Cable Offerings, 1996, The New York Times.
Mar. 22, 2019—EP Office Action—EP 14186382.9.
Nov. 10, 2020—CA Office Action—CA 2,864,621.
Nov. 6, 2020—EP Office Action—EP 14186382.9.
Jan. 12, 2021—Canadian Office Action—CA 2,860,802.
Jan. 13, 2021—Canadian Office Action—CA 2,861,861.
Jun. 23, 2021—Canadian Office Action—CA 2,864,621.
Jun. 22, 2021—European Office Action—EP 14186382.9.
Nov. 3, 2021—Canadian Office Action—CA 2,860,802.
Nov. 5, 2021—Canadian Office Action—CA 2,861,861.
Dec. 9, 2021—European Office Action—14186382.9.
Jan. 3, 2023—EP Office Action—EP App. No. 14186382.9.

\* cited by examiner

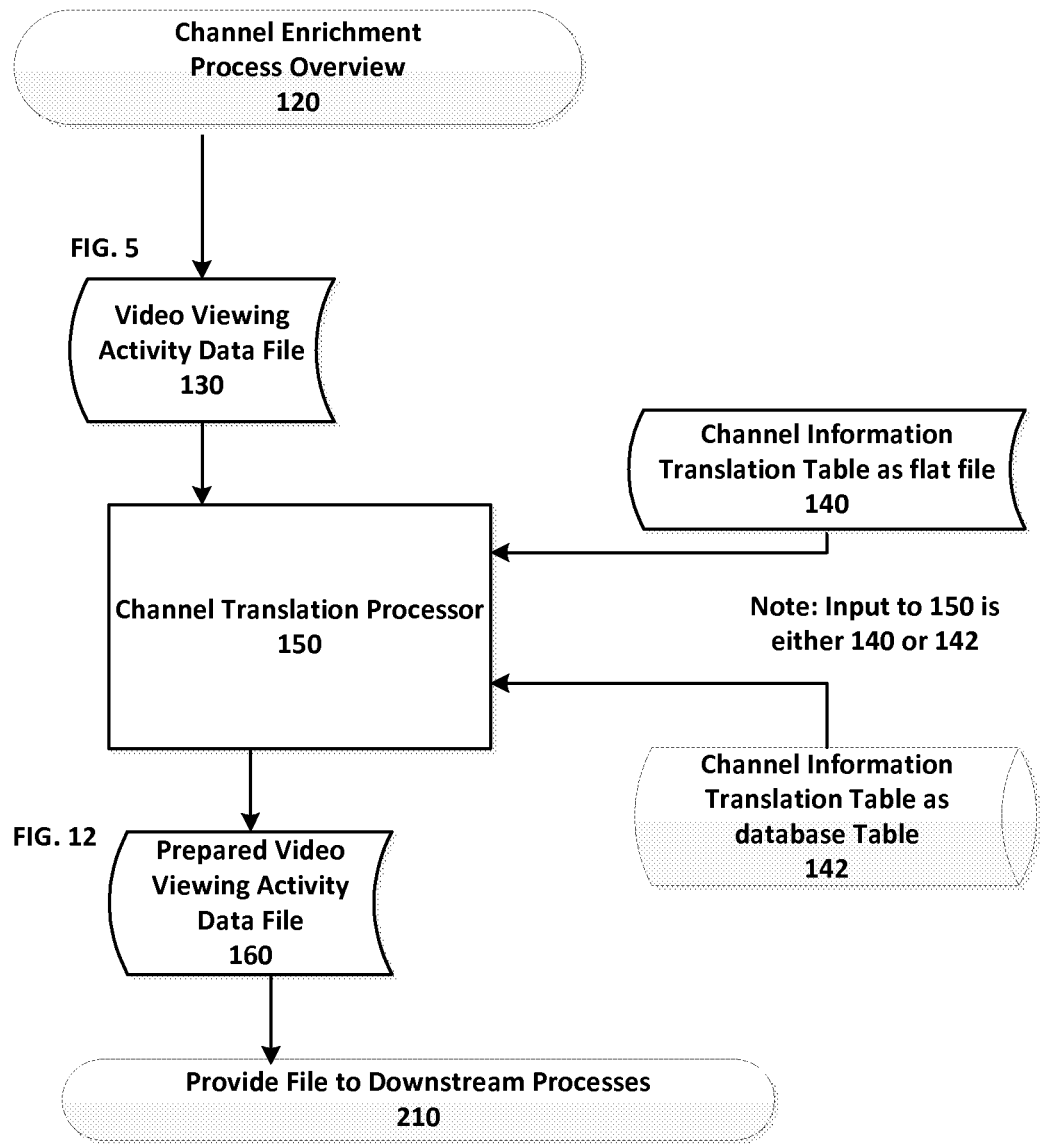

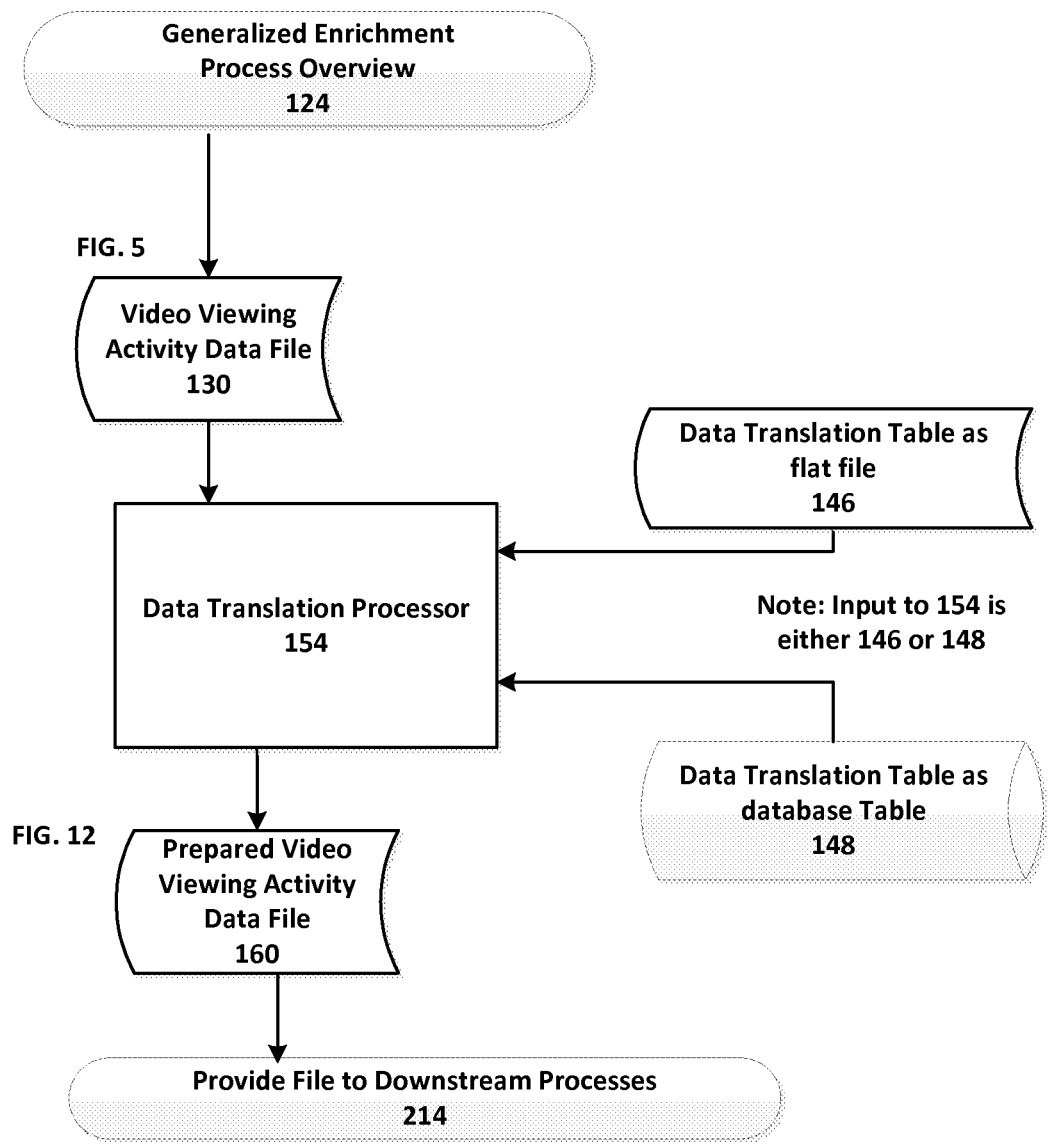

FIG. 5

Summary Information

| Specification Name: | Video Viewing Activity Data File 130 |
|---|---|
| Record description: | The Video Viewing Activity Data contains video viewing activity data from a Media Measurement Data Base or a similar input source. This video viewing activity data can enriched with additional or substitutionary fields prior to sending the file onward to the next step in aggregating the video viewing activity. The next step may be exploding the viewing activity into individual Video Viewing Detail records which can then be ingested by a MapReduce Aggregation Engine as described in my prior applications.<br><br>The video viewing activity can be sourced from Linear Tuning Activity (LTA), or sessionized Linear Viewing Activity (LVA), Digital Video Recording viewing activity (DVR), Video On Demand viewing activity (VOD), Educational viewing activity (EDU), or Live viewing activity (LIV). The Video Viewing Activity Data can hold all of these formats; for certain formats, some fields will be left blank as determined by the analyst.<br><br>There are numerous ways to enrich this data. I will teach several enrichment strategies so that an analyst can choose one or more of them to apply to his particular data set.<br><br>The Video Viewing Activity Data may encompass whatever viewing activity the analyst needs to analyze; this may cover a period of time (an entire day, or primetime viewing), an individual program, DVR viewing, VOD viewing, Educational viewing. Live viewing, etc.<br><br>Note: The list of fields shown below is a superset of fields meaning that it contains fields that may be used in Linear Tuning Activity, Linear Viewing Activity, Digital Video Recording Playback Activity, Video On Demand Activity, Live viewing, and Educational viewing. Not all of these fields will be used in every one of these viewing types. |

FIG. 5 - Continued
Data Structure

| 1000 | 1002 | 1004 | 1006 |
|------|------|------|------|
| NAME | TYPE | SIZE | DESCRIPTION |
| \multicolumn{4}{l}{Notes: By putting the Program Info 1010 in this record, this enables the Translation Processors (150 and 154) to translate the value from a detailed value to an aggregated value prior to writing the Program Info to the Prepared Video Viewing Activity Data File 160 for use by downstream processing.} |

Notes: By putting the Program Info 1010 in this record, this enables the Translation Processors (150 and 154) to translate the value from a detailed value to an aggregated value prior to writing the Program Info to the Prepared Video Viewing Activity Data File 160 for use by downstream processing.

Notes: By putting the Channel Info 1030 in this record, this enables the Translation Processors (150 and 154) to translate the value from a detailed value to an aggregated value prior to writing the Channel Info to the Prepared Video Viewing Detail File 160 for use by downstream processing.

Notes: By Putting the House Info 1040 in this record, this enables the Translation Processors (150 and 154) to translate the value from a detailed value to an aggregated value prior to writing the House Info to the Prepared Video Viewing Activity Data File 160 for use by downstream processing.

Notes: By Putting the Device Info 1050 in this record, this enables the Translation Processors (150 and 154) to translate the value from a detailed value to an aggregated value prior to writing the Device Info to the Prepared Video Viewing Activity Data File 160 for use by downstream processing.

Notes: By Putting the the Viewer Info 1060 in this record, this enables the Translation Processors (150 and 154) to translate the value from a detailed value to an aggregated value prior to writing the Viewer Info to the Prepared Video Viewing Activity Data File 160 for use by downstream processing.

Notes: By Putting the Geographic Information 1070 in this record, this enables the Translation Processors (150 and 154) to translate the value from a detailed value to an aggregated value prior to writing the Geographic Info to the Prepared Video Viewing Activity Data File 160 for use by downstream processing.

Notes: By Putting the Demographic Information 1080 in this record, this enables the Translation Processors (150 and 154) to translate the value from a detailed value to an aggregated value prior to writing the Demographic Info to the Prepared Video Viewing Activity Data File 160 for use by downstream processing.

FIG. 5 – Continued
Data Structure

> Note: Those skilled in the art will readily be able to identify the entities in the Cable Television Laboratories, Inc. Media Measurement Data Model which can be used to populate the fields listed below.

| | | | | |
|---|---|---|---|---|
| 1010~ | PROGRAM_INFO | CHAR | 40 | The Program Information field records information about the program. As a non-limiting example, it may contain any of the following:<br>a) Program identifier<br>b) Program type (news, sports, sitcom, etc.)<br>c) Program genre (romance, mystery, etc.)<br>d) Program name or partial name<br>e) Program rating (G, PG, PG17, etc.)<br>f) Program duration<br>g) Program series flag (Y or N)<br>h) Program season code<br>i) Program episode number<br>j) An online learning course video identifier<br>k) Streaming video identifier |
| 1020~ | PROGRAM_AIRING_INFO | CHAR | 40 | The Program Airing Information field records information about an airing of a program. As a non-limiting example, it may contain any of the following:<br>a) Program airing identifier<br>b) Program airing begin date and time<br>c) Program airing end date and time<br>d) Original airing or replay indicator<br>e) Program identifier + Program airing begin date and time<br>f) A lesson identifier in an online video learning course |

FIG 5 - Data Structure - Continued

| | | | | |
|---|---|---|---|---|
| 1030~ | CHANNEL_INFO | CHAR | 40 | The Channel Information field records information about the channel or network on which the video content aired. As a non-limiting example, it may contain any of the following:<br>a) Actual Channel call sign (this is the network identifier with any High Definition or Standard Definition information; i.e.: DISCHD and DISC)<br>b) Channel call sign (this is the network identifier without any High Definition or Standard Definition information; i.e.: DISC)<br>c) Channel source identifier (a numeric channel identifier)<br>d) Network identifier<br>e) Entertainment Identifier Registry (EIDR) video service identifier (See http://eidr.org/)<br>f) The internet uniform resource locator<br>g) The web address or internet protocol address |
| 1040~ | HOUSE_INFO | CHAR | 40 | The House Information field records information about a house that is linked with the viewing activity that is being measured. As a non-limiting example, it may contain any of the following:<br>a) House identifier<br>b) Commercial building identifier<br>c) Residential, commercial, multi-family, or hotel indicator<br>d) Customer service package accessible by the house<br>e) School or classroom identifier in an online learning environment |

FIG 5 - Data Structure - Continued

| | | | | |
|---|---|---|---|---|
| 1050~ | DEVICE_INFO | CHAR | 40 | The Device Information field records information about a device which was used to view the content for which viewing activity is being measured. As a non-limiting example, it may contain any of the following:<br>a) Device identifier (media access control address, serial number, etc.)<br>b) Device type (TV, smart phone, Internet Protocol TV, set top box, etc.)<br>c) Device characteristic (single tuner, dual tuner, manufacturer, high definition, DVR enabled, etc.) |
| 1060~ | VIEWER_INFO | CHAR | 40 | The Viewer Information field records information about the viewer whose viewing activity is being measured. As a non-limiting example, it may contain any of the following:<br>a) Viewer identifier<br>b) Student identifier in an online learning environment<br>c) Viewer type (parent, child, student, etc.)<br>d) Grade level in an online learning environment<br>e) School name in an online learning environment<br><br>There may be multiple viewers associated with a house. This can identify a specific viewer in the house. Alternatively, it can identify an attribute applicable to multiple viewers. |

FIG 5 - Data Structure - Continued

| | | | | |
|---|---|---|---|---|
| 1070~ | GEOGRAPHIC_INFO | CHAR | 40 | The Geographic Information field records information about the geolocation where the viewing activity that is being measured occurred. As a non-limiting example, it may contain any of the following:<br>    a) A marketing area<br>    b) A zip code<br>    c) A cable operator region<br>    d) A state<br>    e) A county<br>    f) A census tract<br>    g) Cell phone tower identifier<br>    h) Advertising zone<br>    i) Satellite television service area<br>See Geographic information in the DEFINITIONS section for a description of the kinds of geographic values that may be linked with a viewing activity. |
| 1080~ | DEMOGRAPHIC_INFO | CHAR | 40 | The Demographic Information field records demographic data about the viewer whose viewing activity is being measured. As a non-limiting example, it may contain any of the following:<br>    a) Age<br>    b) Income level<br>    c) Education level<br>    d) Languages spoken<br>    e) National origin<br>    f) Occupation<br>    g) Home value<br>    h) Viewing interests<br>    i) Gender<br>    j) Marital status<br>    k) Ages of children in home<br>    l) Proprietary demographic grouping<br>See Demographic information in the DEFINITIONS section for a description of the kinds of demographic values that may be assigned to a viewer. |

FIG 5 - Data Structure - Continued

| | | | | |
|---|---|---|---|---|
| 1090~ | VIEWING_TYPE | CHAR | 3 | The Viewing Type records the the type of viewing activity which is being measured. As a non-limiting example, it may contain any of the following:<br>    a) LTA for linear tuning activity<br>    b) LVA for sessionized linear viewing activity<br>    c) DVR for content being played back from a digital video recording.<br>    d) VOD for content being played from a Video On Demand lease<br>    e) EDU for material from an online educational course<br>    f) LIV for live programming content |
| 1100~ | VIEWING_DATE | DATE | 8 | The Viewing Date records the date of the viewing activity. |
| 1102~ | TUNE_IN_DATE_TIME | DATE TIME | | Tune in date time records the tune in date and time of the viewing activity. |
| 1104~ | TUNE_IN_SECOND_OF_DAY | Number | 5 | Tune In Second of Day records time of the tune in represented as seconds past midnight. |
| 1106~ | TUNE_OUT_DATE_TIME | DATE TIME | | Tune out date and time records the tune out date and time of the viewing activity. |
| 1108~ | TUNE_OUT_SECOND_OF_DAY | Number | 5 | Tune out Second of Day records time of the tune out represented as seconds past midnight. |

FIG 5 - Data Structure - Continued

| | | | | |
|---|---|---|---|---|
| 1110~ | PLAYBACK_MODE | CHAR | 2 | The Playback Mode records information about the speed and direction of the video content during viewing. Suggested values include:<br>a) PL for Play<br>b) F1 for Fast Forward at 1x speed<br>c) F2 for Fast Forward at 2x speed<br>d) F3 for Fast Forward at 3x speed<br>e) F4 for Fast Forward at 4x speed<br>f) R1 for Reverse at 1x speed<br>g) R2 for Reverse at 2x speed<br>h) R3 for Reverse at 3x speed<br>i) R4 for Reverse at 4x speed<br>j) PA for Pause<br>k) ST for Stop<br>l) RE for Resume |
| 1120~ | PLAYBACK_BEG_POSITION | Number | 5 | The Playback Begin Position records the starting point (beginning) of the viewing activity represented by PLAYBACK_MODE based on the actual location in the content from a fixed reference point in the content. The fixed reference point is normally the first second (or frame) of the content (second 0), but it can be any fixed reference point. Having all viewing activity normalized to a fixed reference point enables consistent measurement across many devices operated by many viewers, even when their individual recordings (in the case of DVR) or viewing activity did not begin at the start of the content.<br><br>This is also referred to as the Beginning Offset Second from the True Beginning. |

FIG 5 - Data Structure - Continued

| | | | | |
|---|---|---|---|---|
| 1130~ | PLAYBACK_END_POSITION | Number | 5 | The Playback End Position records the ending point of the viewing activity represented by PLAYBACK_MODE based on the actual location in the content from a fixed reference point in the content. The fixed reference point is normally the first second (or frame) of the content (second 0), but it can be any fixed reference point. Having all viewing activity normalized to a fixed reference point enables consistent measurement across many devices operated by many viewers, even when their individual recordings (in the case of DVR) or viewing activity did not begin at the start of the content.<br><br>This is also referred to as the Ending Offset Second from the True Beginning. |
| 1138~ | TUNE_DURATION_SECONDS | Number | 5 | Tune Duration Seconds records the duration of the tuning event in seconds. |
| 1140~ | ACTIVITY_DURATION_SECONDS | Number | 5 | The Activity Duration field records the duration of the activity represented by the Playback Mode. |
| 1150~ | PRESENTATION_INFO | CHAR | 4 | The Presentation Information field records information about the presentation of the video content for which viewing activity is being measured. As a non-limiting example, it may contain any of the following:<br>    a) Volume level<br>    b) Muting<br>    c) Closed captioning<br>    d) Picture in picture active indicator<br>    e) Percent of content visible<br>    f) Percent of screen used by content |

FIG 5 - Data Structure - Continued

| | | | | |
|---|---|---|---|---|
| 1160~ | VIDEO_SERVER_INFO | CHAR | 40 | The Video Server Information field records information about the video server that served the video stream for which viewing activity is being measured. As a non-limiting example, it may contain any of the following:<br>    a) A computer system identifier<br>    b) A headend identifier<br>    c) A hub identifier<br>    d) A satellite identifier<br>    e) A web server<br>    f) A content delivery system identifier |
| 1170~ | SYSTEM_HEALTH_INFO | CHAR | 40 | The System Health Information field records information about the health of the video server that served the video stream for which viewing activity is being measured. As a non-limiting example, it may contain any of the following:<br>    a) A system status indicator<br>    b) An error code |

FIG. 6
Summary Information

| Specification Name: | Channel Information Translation Table 140 or 142 |
|---|---|
| Record description: | The Channel Information Translation Table contains information needed to translate from a source channel to a corresponding target channel. The Channel Information Translation Table may be presented to the Channel Translation Processor 150 as either a flat file 140 which can be loaded to an array in the memory of the computer, or as a data table which can be joined to 142.<br>The Channel Translation Processor 150 can be written to accept either form of input. |

Data Structure

|  | 1800<br>NAME | 1802<br>TYPE | 1804<br>SIZE | 1806<br>DESCRIPTION |
|---|---|---|---|---|
| 1810~ | SOURCE_CHANNEL_INFORMATION_IN | CHAR | 40 | The Source Channel Information field contains a value which matches the value which is found in the Channel Information field 1030 in the Video Viewing Activity Data File 130.<br>This is the "from" value. |
| 1820~ | TARGET_CHANNEL_INFORMATION_IN | CHAR | 40 | The Target Channel Information field contains the value which is to be used in the aggregation process. The Channel Information field 1030 in the Video Viewing Activity Data File 130 can be replaced with this Target Channel Information field or a new field can be appended to the Video Viewing Activity Data File 130 record containing the Target Channel Information field. Either method will allow the viewing activity in the Prepared Video Viewing Activity Data File to be aggregated by the Target Channel Information field.<br>This is the "to" value.<br>In FIG 3 Step 2 I describe appending the translated value to the output file as Channel_Info_Target 1400. |

FIG. 6 - Sample Data – Continued

Example 1:
Translating Standard Definition and High Definition Call Signs to a Common Call Sign.

| 1810 | 1820 |
|---|---|
| SOURCE_CHANNEL_INFORMATION_IN | TARGET_CHANNEL_INFORMATION_IN |
| HIST | HIST |
| HISTHD | HIST |
| FOX | FOX |
| FOXHD | FOX |

Example 2:
Translating selected Standard Definition and High Definition Call Signs to a Common Call Sign AND everything else to OTHER.

| 1810 | 1820 |
|---|---|
| SOURCE_CHANNEL_INFORMATION_IN | TARGET_CHANNEL_INFORMATION_IN |
| HIST | HIST |
| HISTHD | HIST |
| DISC | OTHER |
| ESPN | OTHER |
| FOX | OTHER |

FIG. 7
Summary Information

| Specification Name: | Channel Mapping Definition Array Data Structure |
|---|---|
| Record description: | The Channel Mapping Definition Array Data Structure is the data structure used to record the Channel Mapping Definitions in the memory of the computer. This Data Structure is loaded from the Channel Information Translation Table 140, FIG 6.<br><br>Usage: During the data translation process, as part of enriching the Video Viewing data, the Data Translation Processor 150 looks for a match on the Channel Information in the Video Viewing Activity Record with the value in CHAN-MAP-CHAN-INFO-SOURCE 1910. Then the system enriches the Video Viewing Record with the CHAN-MAP-CHAN-INFO-TARGET 1920. |

Data Structure

|  | NAME<br>1900 | TYPE<br>1902 | SIZE<br>1904 | DESCRIPTION<br>1906 |
|---|---|---|---|---|
|  | colspan=4 | The following fields occur 600 times to allow for 600 Channel Mappings to be processed. This can be changed as needed.<br><br>Note: Mapping multiple source channels to a single target channel enables the analysis of viewing activity across different channels that carry the same content while maintaining the detail tuning events in the source video viewing activity file for use in specific channel viewing measurements such as bandwidth consumption.<br>Note: The Channel Information field is not limited to channel call signs. |  |  |  |
| 1910~ | CHAN-MAP-CHAN-INFO-SOURCE | CHAR | 40 | The Source Channel Map Channel Information as represented in the file. Populated from FIG 6 1810. |
| 1920~ | CHAN-MAP-CHAN-INFO-TARGET | CHAR | 40 | The Channel Map Channel Information that should be used for aggregation purposes; the target channel information.<br>Populated from FIG 6 1820. |

FIG. 8
Summary Information

| Specification Name: | Data Translation Table 146 or 148 |
|---|---|
| Record description: | The Data Translation Table contains information needed to translate from a source value to a corresponding target value. The Data Translation Table may be presented to the Data Translation Processor 154 as either a flat file which can be loaded to an array in the memory of the computer, or as a data table which can be joined to.<br><br>I have shown this as either a flat file Data Translation Table 146 or as a database table Data Translation Table 148.<br><br>The Data Translation Processor 154 can be written to accept either form of input. |

Data Structure

| | 2000 | 2002 | 2004 | 2006 |
|---|---|---|---|---|
| | NAME | TYPE | SIZE | DESCRIPTION |
| | Notes: By putting TRANSLATION_VALUE_TYPE_IN 2005 in this record, this enables the analyst to define any manner of translation values as needed. This provides a great deal of flexibility in mapping from a more detailed set of values to one or more general values which has the effect of making the downstream aggregation process run faster. | | | |
| 2005~ | TRANSLATION_VA LUE_TYPE-IN | CHAR | 40 | The Translation Value Type field contains a value which identifies the kind of data found in the corresponding Source and Target Translation Values. Non-limiting examples include:<br>   (i) program information,<br>   (ii) channel information,<br>   (iii) house information,<br>   (iv) device information,<br>   (v) viewer information,<br>   (vi) geographic information,<br>   (vii) demographic information. |

FIG 8 - Data Structure – Continued

| | | | | |
|---|---|---|---|---|
| 2010~ | SOURCE_TRANSLA TION_VALUE-IN | CHAR | 40 | The Source Translation Value field contains a value which matches the value which is found in the Video Viewing Activity Data File 130 for the field specified by the field type indicated by the Source Translation Type field. This is the "from" value.<br>The analyst can use any value that will allow him to match on the data values that are present in the Video Viewing Activity Data File 130.<br><br>As a non-limiting examples,<br>when the Source Translation Type represents Program Information, then this Source Translation Value field may contain any value that will be found in field PROGRAM_INFO 1010;<br><br>when the Source Translation Type represents Channel Information, then this Source Translation Value field may contain any value that will be found in field CHANNEL_INFO 1030;<br><br>when the Source Translation Type represents House Information, then this Source Translation Value field may contain any value that will be found in field HOUSE_INFO 1040;<br><br>when the Source Translation Type represents Device Information, then this Source Translation Value field may contain any value that will be found in field DEVICE_INFO 1050;<br><br>when the Source Translation Type represents Viewer Information, then this Source Translation Value field may contain any value that will be found in field VIEWER_INFO 1060;<br><br>when the Source Translation Type represents Geographic Information, then this Source Translation Value field may contain any value that will be found in field GEOGRAPHIC_INFO 1070;<br><br>when the Source Translation Type represents Demographic Information, then this Source Translation Value field may contain any value that will be found in field DEMOGRAPHIC_INFO 1080. |

FIG 8 - Data Structure - Continued

| | | | | |
|---|---|---|---|---|
| 2020~ | TARGET_TRANSLA TION_VALUE-IN | CHAR | 40 | The Target Translation Value field contains the value which is to be used in the aggregation process. The field in the Video Viewing Activity Data File 130 can be replaced with this Target Translation Value field or a new field can be appended to the Video Viewing Activity Data File 130 record containing the Target Translation Value field to create the Prepared Video Viewing Activity File. Either method will allow the viewing activity in the Prepared Video Viewing Activity Data File 160 to be aggregated by the Target Translation Value field. This is the "to" value.<br><br>The analyst has a great deal of flexibility in defining the target translation values.<br><br>As non-limiting example, these values can be used to map like values to a standard value such as would be the case with mapping the Standard Definition and High Definition Channel Call Signs (ex: DISC and DISCHD) to a common Channel Call Sign (ex: DISC).<br><br>Also as non-limiting example, these values can be used to map detailed values to values that will be used for aggregation. If an analyst needs to compare viewing of sports programming to all other concurrent programming, he may choose to leave any sports content with its original channel identifier and then replace any other content with a channel identifier of 'OTHER'. This will significantly reduce the load on the MapReduce framework (because the number of unique keys will be much smaller) while providing detailed analysis of the various sports channels.<br><br>The FIG 8 examples below provide numerous examples of data translations. |

FIG. 8 - Sample Data – Continued

Example 1:
Translating Program Information to a Program Type and everything else to OTHER

| 2005 | 2010 | 2020 |
|---|---|---|
| TRANSLATION_VALUE_TYPE_IN | SOURCE_TRANSLATION_VALUE_IN | TARGET_TRANSLATION_VALUE_IN |
| PROGRAM | SPORT | SPORT |
| PROGRAM | DOCU | OTHER |
| PROGRAM | NATU | OTHER |
| PROGRAM | NEWS | OTHER |

Example 2:
Translating Standard Definition and High Definition Channel Call Signs to a Common Channel Call Sign

| 2005 | 2010 | 2020 |
|---|---|---|
| TRANSLATION_VALUE_TYPE_IN | SOURCE_TRANSLATION_VALUE_IN | TARGET_TRANSLATION_VALUE_IN |
| CHANNEL | HIST | HIST |
| CHANNEL | HISTHD | HIST |
| CHANNEL | FOX | FOX |
| CHANNEL | FOXHD | FOX |

Example 3:
Translating selected Standard Definition and High Definition Channel Call Signs to a Common Channel Call Sign AND everything else to OTHER

| 2005 | 2010 | 2020 |
|---|---|---|
| TRANSLATION_VALUE_TYPE_IN | SOURCE_TRANSLATION_VALUE_IN | TARGET_TRANSLATION_VALUE_IN |
| CHANNEL | HIST | HIST |
| CHANNEL | HISTHD | HIST |
| CHANNEL | DISC | OTHER |
| CHANNEL | ESPN | OTHER |
| CHANNEL | FOX | OTHER |

FIG. 8 - Sample Data - Continued

Example 4:
Translating selected House Information to one value (HOUSE) and everything else to OTHER

| 2005 | 2010 | 2020 |
|---|---|---|
| TRANSLATION_VALUE_TYPE_IN | SOURCE_TRANSLATION_VALUE_IN | TARGET_TRANSLATION_VALUE_IN |
| HOUSE | HOUSE | HOUSE |
| HOUSE | APT | OTHER |
| HOUSE | OFFICE | OTHER |
| HOUSE | SCHOOL | OTHER |

Example 5:
Translating selected Device Information to one value (STB) and everything else to OTHER

| 2005 | 2010 | 2020 |
|---|---|---|
| TRANSLATION_VALUE_TYPE_IN | SOURCE_TRANSLATION_VALUE_IN | TARGET_TRANSLATION_VALUE_IN |
| DEVICE | STB | STB |
| DEVICE | IPTV | OTHER |
| DEVICE | TABLET | OTHER |
| DEVICE | PHONE | OTHER |

Example 6:
Translating selected Viewer Information to one value (PARENT) and everything else to OTHER

| 2005 | 2010 | 2020 |
|---|---|---|
| TRANSLATION_VALUE_TYPE_IN | SOURCE_TRANSLATION_VALUE_IN | TARGET_TRANSLATION_VALUE_IN |
| VIEWER | PARENT | PARENT |
| VIEWER | CHILD | OTHER |
| VIEWER | STUDENT | OTHER |

FIG. 8 - Sample Data - Continued

Example 7:
Translating Geographic Information from a detailed value to a higher value.

| 2005 | 2010 | 2020 |
|---|---|---|
| TRANSLATION_VALUE_TYPE_IN | SOURCE_TRANSLATION_VALUE_IN | TARGET_TRANSLATION_VALUE_IN |
| GEOGRAPHIC | 80111 | 801XX |
| GEOGRAPHIC | 80112 | 801XX |
| GEOGRAPHIC | 80113 | 801XX |
| GEOGRAPHIC | 80114 | 801XX |
| GEOGRAPHIC | 80115 | 801XX |

Example 8:
Translating Demographic Information from a detailed value to a higher value

| 2005 | 2010 | 2020 |
|---|---|---|
| TRANSLATION_VALUE_TYPE_IN | SOURCE_TRANSLATION_VALUE_IN | TARGET_TRANSLATION_VALUE_IN |
| DEMOGRAPHIC | 1-3 YR | CHILD |
| DEMOGRAPHIC | 4-5 YR | CHILD |
| DEMOGRAPHIC | 6-8 YR | CHILD |
| DEMOGRAPHIC | 21-44 YR | ADULT |
| DEMOGRAPHIC | 45-54 YR | ADULT |

FIG. 9
Summary Information

| Specification Name: | Generalized Mapping Definition Array Data Structure |
|---|---|
| Record description: | The Generalized Mapping Definition Array Data Structure is the data structure used to record the Data Translation Table Mapping Definitions in the memory of the computer. This Data Structure is loaded from the Data Translation Table 146, FIG 8.<br><br>Usage: The Data Translation Processor 154, as part of enriching the Video Viewing data, looks for a match against `SOURCE_TRANSLATION_VALUE` on the field indicated by `TRANSLATION_VALUE_TYPE`. Then the Processor 154 builds the Video Viewing Activity Record with the `TARGET_TRANSLATION_VALUE`. The logic for this process is described in FIG 4. |

Data Structure

|  | NAME (2100) | TYPE (2102) | SIZE (2104) | DESCRIPTION (2106) |
|---|---|---|---|---|
|  | colspan: The following fields occur 1000 times to allow for 1000 Data Translation Mappings to be processed. This can be changed as needed.<br><br>Note: Providing multiple translation types with their corresponding source and target translation values allows the analyst to translate multiple values in preparation for aggregation by the MapReduce framework. As a non-limiting example, he may translate both channel information and demographic information to prepare for a particular analytical study. The original source data remains unchanged so that it can be used in any number of studies, some of which may require the original values. | | | |
| 2105~ | `TRANSLATION_VALUE_TYPE` | CHAR | 40 | The Translation Value Type. Populated from FIG 8 2005. |
| 2110~ | `SOURCE_TRANSLATION_VALUE` | CHAR | 40 | The Source Translation Value. Populated from FIG 8 2010. |
| 2120~ | `TARGET_TRANSLATION_VALUE` | CHAR | 40 | The Target Translation Value. Populated from FIG 8 2020. |

FIG. 10 - Sample Data

Example 1:

Sample Data for LTA showing Geographic Information Translation from a detailed value to a higher value

Geographic Information - Before

| GEO-GRAPHIC INFO | VIDEO SERVER INFO | CHAN-NEL INFO | VIEW-ING DEVICE | HOUSE | VIEWER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1070 | 1160 | 1030 | 1050 | 1040 | 1060 | 1080 | 1102 | 1104 | 1106 | 1108 | 1138 |
| 80111 | SERVER-01 | ABC | 1 | H1 | U1 | 40-60k | 2013-08-01 18:00:00 | 64800 | 2013-08-01 18:00:05 | 64805 | 6 |
| 80112 | SERVER-01 | ABC | 2 | H2 | U2 | 40-60k | 2013-08-01 18:00:01 | 68401 | 2013-08-01 18:00:07 | 68407 | 7 |
| 80113 | SERVER-01 | DISC | 3 | H3 | U3 | 60-80K | 2013-08-01 18:00:02 | 68402 | 2013-08-01 18:00:06 | 68406 | 5 |
| 80114 | SERVER-01 | DISC | 3 | H3 | U3 | 60-80K | 2013-08-01 18:00:04 | 68404 | 2013-08-01 18:00:06 | 68406 | 3 |
| 80115 | SERVER-01 | DISC | 4 | H4 | U4 | 80-110K | 2013-08-01 18:00:03 | 68403 | 2013-08-01 18:00:09 | 68409 | 7 |
| 80111 | SERVER-01 | ESPN | 5 | H5 | U5 | 80-110K | 2013-08-01 18:00:04 | 68404 | 2013-08-01 18:00:11 | 68411 | 8 |

Geographic Information - After

| GEO-GRAPHIC INFO | VIDEO SERVER INFO | CHAN-NEL INFO | VIEW-ING DEVICE | HOUSE | VIEWER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1270 | 1360 | 1230 | 1250 | 1240 | 1260 | 1280 | 1302 | 1304 | 1306 | 1308 | 1338 |
| 801XX | SERVER-01 | ABC | 1 | H1 | U1 | 40-60k | 2013-08-01 18:00:00 | 64800 | 2013-08-01 18:00:05 | 64805 | 6 |
| 801XX | SERVER-01 | ABC | 2 | H2 | U2 | 40-60k | 2013-08-01 18:00:01 | 68401 | 2013-08-01 18:00:07 | 68407 | 7 |
| 801XX | SERVER-01 | DISC | 3 | H3 | U3 | 60-80K | 2013-08-01 18:00:02 | 68402 | 2013-08-01 18:00:06 | 68406 | 5 |
| 801XX | SERVER-01 | DISC | 3 | H3 | U3 | 60-80K | 2013-08-01 18:00:04 | 68404 | 2013-08-01 18:00:06 | 68406 | 3 |
| 801XX | SERVER-01 | DISC | 4 | H4 | U4 | 80-110K | 2013-08-01 18:00:03 | 68403 | 2013-08-01 18:00:09 | 68409 | 7 |
| 801XX | SERVER-01 | ESPN | 5 | H5 | U5 | 80-110K | 2013-08-01 18:00:04 | 68404 | 2013-08-01 18:00:11 | 68411 | 8 |

FIG. 10 - Sample Data – Continued

Example 2:

Sample Data for LTA showing Channel Information Translation
Translating Channel Identifier to a Common Channel Identifier from normal and HD versions of the channel Channel Information - Before

| GEO-GRAPHIC INFO | VIDEO SERVER INFO | CHAN-NEL INFO | VIEW-ING DEVICE | HOUSE | VIEW ER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1070 | 1160 | 1030 | 1050 | 1040 | 1060 | 1080 | 1102 | 1104 | 1106 | 1108 | 1138 |
| 80111 | SERVER-01 | HIST | 1 | H1 | U1 | 40-60k | 2013-08-01 18:00:00 | 64800 | 2013-08-01 18:00:05 | 64805 | 6 |
| 80112 | SERVER-01 | HISTHD | 2 | H2 | U2 | 40-60k | 2013-08-01 18:00:01 | 68401 | 2013-08-01 18:00:07 | 68407 | 7 |
| 80113 | SERVER-01 | FOX | 3 | H3 | U3 | 60-80K | 2013-08-01 18:00:02 | 68402 | 2013-08-01 18:00:06 | 68406 | 5 |
| 80114 | SERVER-01 | FOXHD | 3 | H3 | U3 | 60-80K | 2013-08-01 18:00:04 | 68404 | 2013-08-01 18:00:06 | 68406 | 3 |

Channel Information - After

| GEO-GRAPHIC INFO | VIDEO SERVER INFO | CHAN-NEL INFO | VIEW-ING DEVICE | HOUSE | VIEW ER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1270 | 1360 | 1230 | 1250 | 1240 | 1260 | 1280 | 1302 | 1304 | 1306 | 1308 | 1338 |
| 80111 | SERVER-01 | HIST | 1 | H1 | U1 | 40-60k | 2013-08-01 18:00:00 | 64800 | 2013-08-01 18:00:05 | 64805 | 6 |
| 80112 | SERVER-01 | HIST | 2 | H2 | U2 | 40-60k | 2013-08-01 18:00:01 | 68401 | 2013-08-01 18:00:07 | 68407 | 7 |
| 80113 | SERVER-01 | FOX | 3 | H3 | U3 | 60-80K | 2013-08-01 18:00:02 | 68402 | 2013-08-01 18:00:06 | 68406 | 5 |
| 80114 | SERVER-01 | FOX | 3 | H3 | U3 | 60-80K | 2013-08-01 18:00:04 | 68404 | 2013-08-01 18:00:06 | 68406 | 3 |

FIG. 10 - Sample Data – Continued

Example 3:

Sample Data for LTA showing Channel Information Translation
Channel Example – Translating Channel Identifier to a Common Channel Identifier and All OTHER

Channel Information - Before

| GEO-GRAPHIC INFO | VIDEO SERVER INFO | CHAN-NEL INFO | VIEW-ING DEVICE | HOUSE | VIEWER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1070 | 1160 | 1030 | 1050 | 1040 | 1060 | 1080 | 1102 | 1104 | 1106 | 1108 | 1138 |
| 80111 | SERVER-01 | HIST | 1 | H1 | U1 | 40-60k | 2013-08-01 18:00:00 | 64800 | 2013-08-01 18:00:05 | 64805 | 6 |
| 80112 | SERVER-01 | HISTHD | 2 | H2 | U2 | 40-60k | 2013-08-01 18:00:01 | 68401 | 2013-08-01 18:00:07 | 68407 | 7 |
| 80113 | SERVER-01 | DISC | 3 | H3 | U3 | 60-80K | 2013-08-01 18:00:02 | 68402 | 2013-08-01 18:00:06 | 68406 | 5 |
| 80114 | SERVER-01 | ESPN | 3 | H3 | U3 | 60-80K | 2013-08-01 18:00:04 | 68404 | 2013-08-01 18:00:06 | 68406 | 3 |
| 801XX | SERVER-01 | FOX | 4 | H4 | U4 | 80-110K | 2013-08-01 18:00:03 | 68403 | 2013-08-01 18:00:09 | 68409 | 7 |

Channel Information - After

| GEO-GRAPHIC INFO | VIDEO SERVER INFO | CHAN-NEL INFO | VIEW-ING DEVICE | HOUSE | VIEWER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1270 | 1360 | 1230 | 1250 | 1240 | 1260 | 1280 | 1302 | 1304 | 1306 | 1308 | 1338 |
| 80111 | SERVER-01 | HIST | 1 | H1 | U1 | 40-60k | 2013-08-01 18:00:00 | 64800 | 2013-08-01 18:00:05 | 64805 | 6 |
| 80112 | SERVER-01 | HIST | 2 | H2 | U2 | 40-60k | 2013-08-01 18:00:01 | 68401 | 2013-08-01 18:00:07 | 68407 | 7 |
| 80113 | SERVER-01 | OTHER | 3 | H3 | U3 | 60-80K | 2013-08-01 18:00:02 | 68402 | 2013-08-01 18:00:06 | 68406 | 5 |
| 80114 | SERVER-01 | OTHER | 3 | H3 | U3 | 60-80K | 2013-08-01 18:00:04 | 68404 | 2013-08-01 18:00:06 | 68406 | 3 |
| 801XX | SERVER-01 | OTHER | 4 | H4 | U4 | 80-110K | 2013-08-01 18:00:03 | 68403 | 2013-08-01 18:00:09 | 68409 | 7 |

FIG. 10 - Sample Data – Continued

Example 4:

Sample Data for LTA showing Device Information Translation
Device Example – Translating Device Identifier to Common Device Identifier and All OTHER

Device Information - Before

| GEO-GRAPHIC INFO | VIDEO SERVER INFO | CHAN-NEL INFO | VIEW-ING DEVICE | HOUSE | VIEWER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1070 | 1160 | 1030 | 1050 | 1040 | 1060 | 1080 | 1102 | 1104 | 1106 | 1108 | 1138 |
| 80111 | SERVER-01 | HIST | STB | HOUSE | U1 | 40-60k | 2013-08-01 18:00:00 | 64800 | 2013-08-01 18:00:05 | 64805 | 6 |
| 80112 | SERVER-01 | HISTHD | IPTV | APT | U2 | 40-60k | 2013-08-01 18:00:01 | 68401 | 2013-08-01 18:00:07 | 68407 | 7 |
| 80113 | SERVER-01 | DISC | TABLET | OFFICE | U3 | 60-80K | 2013-08-01 18:00:02 | 68402 | 2013-08-01 18:00:06 | 68406 | 5 |
| 80114 | SERVER-01 | ESPN | PHONE | SCHOOL | U3 | 60-80K | 2013-08-01 18:00:04 | 68404 | 2013-08-01 18:00:06 | 68406 | 3 |
| 801XX | SERVER-01 | FOX | STB | HOUSE | U4 | 80-110K | 2013-08-01 18:00:03 | 68403 | 2013-08-01 18:00:09 | 68409 | 7 |

Device Information - After

| GEO-GRAPHIC INFO | VIDEO SERVER INFO | CHAN-NEL INFO | VIEW-ING DEVICE | HOUSE | VIEWER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1270 | 1360 | 1230 | 1250 | 1240 | 1260 | 1280 | 1302 | 1304 | 1306 | 1308 | 1338 |
| 80111 | SERVER-01 | HIST | STB | HOUSE | U1 | 40-60k | 2013-08-01 18:00:00 | 64800 | 2013-08-01 18:00:05 | 64805 | 6 |
| 80112 | SERVER-01 | HISTHD | OTHER | APT | U2 | 40-60k | 2013-08-01 18:00:01 | 68401 | 2013-08-01 18:00:07 | 68407 | 7 |
| 80113 | SERVER-01 | DISC | OTHER | OFFICE | U3 | 60-80K | 2013-08-01 18:00:02 | 68402 | 2013-08-01 18:00:06 | 68406 | 5 |
| 80114 | SERVER-01 | ESPN | OTHER | SCHOOL | U3 | 60-80K | 2013-08-01 18:00:04 | 68404 | 2013-08-01 18:00:06 | 68406 | 3 |
| 801XX | SERVER-01 | FOX | STB | HOUSE | U4 | 80-110K | 2013-08-01 18:00:03 | 68403 | 2013-08-01 18:00:09 | 68409 | 7 |

FIG. 10 - Sample Data – Continued

Example 5:

Sample Data for LTA showing House Information Translation
House Example – Translating House Identifier to Common House Identifier and All OTHER House Information - Before

| GEO-GRAPHIC INFO | VIDEO SERVER INFO | CHAN-NEL INFO | VIEW-ING DEVICE | HOUSE | VIEWER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1070 | 1160 | 1030 | 1050 | 1040 | 1060 | 1080 | 1102 | 1104 | 1106 | 1108 | 1138 |
| 80111 | SERVER-01 | HIST | 1 | HOUSE | U1 | 40-60k | 2013-08-01 18:00:00 | 64800 | 2013-08-01 18:00:05 | 64805 | 6 |
| 80112 | SERVER-01 | HISTHD | 2 | APT | U2 | 40-60k | 2013-08-01 18:00:01 | 68401 | 2013-08-01 18:00:07 | 68407 | 7 |
| 80113 | SERVER-01 | DISC | 3 | OFFICE | U3 | 60-80K | 2013-08-01 18:00:02 | 68402 | 2013-08-01 18:00:06 | 68406 | 5 |
| 80114 | SERVER-01 | ESPN | 3 | SCHOOL | U3 | 60-80K | 2013-08-01 18:00:04 | 68404 | 2013-08-01 18:00:06 | 68406 | 3 |
| 801XX | SERVER-01 | FOX | 4 | HOUSE | U4 | 80-110K | 2013-08-01 18:00:03 | 68403 | 2013-08-01 18:00:09 | 68409 | 7 |

House Information - After

| GEO-GRAPHIC INFO | VIDEO SERVER INFO | CHAN-NEL INFO | VIEW-ING DEVICE | HOUSE | VIEWER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1270 | 1360 | 1230 | 1250 | 1240 | 1260 | 1280 | 1302 | 1304 | 1306 | 1308 | 1338 |
| 80111 | SERVER-01 | HIST | 1 | HOUSE | U1 | 40-60k | 2013-08-01 18:00:00 | 64800 | 2013-08-01 18:00:05 | 64805 | 6 |
| 80112 | SERVER-01 | HISTHD | 2 | OTHER | U2 | 40-60k | 2013-08-01 18:00:01 | 68401 | 2013-08-01 18:00:07 | 68407 | 7 |
| 80113 | SERVER-01 | DISC | 3 | OTHER | U3 | 60-80K | 2013-08-01 18:00:02 | 68402 | 2013-08-01 18:00:06 | 68406 | 5 |
| 80114 | SERVER-01 | ESPN | 3 | OTHER | U3 | 60-80K | 2013-08-01 18:00:04 | 68404 | 2013-08-01 18:00:06 | 68406 | 3 |
| 801XX | SERVER-01 | FOX | 4 | HOUSE | U4 | 80-110K | 2013-08-01 18:00:03 | 68403 | 2013-08-01 18:00:09 | 68409 | 7 |

FIG. 10 - Sample Data – Continued

Example 6:

Sample Data for LTA showing Viewer Information Translation
Viewer Example – Translating Viewer Identifier to Common Viewer Identifier and All OTHER

Viewer Information - Before

| GEO-GRAPHIC INFO | VIDEO SERVER INFO | CHAN-NEL INFO | VIEW-ING DEVICE | HOUSE | VIEWER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1070 | 1160 | 1030 | 1050 | 1040 | 1060 | 1080 | 1102 | 1104 | 1106 | 1108 | 1138 |
| 80111 | SERVER-01 | HIST | 1 | HOUSE | PARENT | 40-60k | 2013-08-01 18:00:00 | 64800 | 2013-08-01 18:00:05 | 64805 | 6 |
| 80112 | SERVER-01 | HISTHD | 2 | APT | CHILD | 40-60k | 2013-08-01 18:00:01 | 68401 | 2013-08-01 18:00:07 | 68407 | 7 |
| 80113 | SERVER-01 | DISC | 3 | OFFICE | STUDENT | 60-80K | 2013-08-01 18:00:02 | 68402 | 2013-08-01 18:00:06 | 68406 | 5 |
| 80114 | SERVER-01 | ESPN | 3 | SCHOOL | PARENT | 60-80K | 2013-08-01 18:00:04 | 68404 | 2013-08-01 18:00:06 | 68406 | 3 |
| 801XX | SERVER-01 | FOX | 4 | HOUSE | CHILD | 80-110K | 2013-08-01 18:00:03 | 68403 | 2013-08-01 18:00:09 | 68409 | 7 |

Viewer Information - After

| GEO-GRAPHIC INFO | VIDEO SERVER INFO | CHAN-NEL INFO | VIEW-ING DEVICE | HOUSE | VIEWER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1270 | 1360 | 1230 | 1250 | 1240 | 1260 | 1280 | 1302 | 1304 | 1306 | 1308 | 1338 |
| 80111 | SERVER-01 | HIST | 1 | HOUSE | PARENT | 40-60k | 2013-08-01 18:00:00 | 64800 | 2013-08-01 18:00:05 | 64805 | 6 |
| 80112 | SERVER-01 | HISTHD | 2 | APT | OTHER | 40-60k | 2013-08-01 18:00:01 | 68401 | 2013-08-01 18:00:07 | 68407 | 7 |
| 80113 | SERVER-01 | DISC | 3 | OFFICE | OTHER | 60-80K | 2013-08-01 18:00:02 | 68402 | 2013-08-01 18:00:06 | 68406 | 5 |
| 80114 | SERVER-01 | ESPN | 3 | SCHOOL | PARENT | 60-80K | 2013-08-01 18:00:04 | 68404 | 2013-08-01 18:00:06 | 68406 | 3 |
| 801XX | SERVER-01 | FOX | 4 | HOUSE | OTHER | 80-110K | 2013-08-01 18:00:03 | 68403 | 2013-08-01 18:00:09 | 68409 | 7 |

FIG. 10 - Sample Data – Continued

Example 7:

Sample Data for LTA showing Demographic Information Translation
Demographic Example – Translating Demographic Information from a detailed value to a higher value
OTHER Demographic Information - Before

| GEO-GRAPHIC INFO | VIDEO SERVER INFO | CHAN-NEL INFO | VIEW-ING DEVICE | HOUSE | VIEWER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1070 | 1160 | 1030 | 1050 | 1040 | 1060 | 1080 | 1102 | 1104 | 1106 | 1108 | 1138 |
| 80111 | SERVER-01 | HIST | 1 | HOUSE | U1 | 1-3 YR | 2013-08-01 18:00:00 | 64800 | 2013-08-01 18:00:05 | 64805 | 6 |
| 80112 | SERVER-01 | HISTHD | 2 | APT | U2 | 4-5 YR | 2013-08-01 18:00:01 | 68401 | 2013-08-01 18:00:07 | 68407 | 7 |
| 80113 | SERVER-01 | DISC | 3 | OFFICE | U3 | 6-8 YR | 2013-08-01 18:00:02 | 68402 | 2013-08-01 18:00:06 | 68406 | 5 |
| 80114 | SERVER-01 | ESPN | 3 | SCHOOL | U4 | 4-5 YR | 2013-08-01 18:00:04 | 68404 | 2013-08-01 18:00:06 | 68406 | 3 |
| 801XX | SERVER-01 | FOX | 4 | HOUSE | U5 | 21-44 YR | 2013-08-01 18:00:03 | 68403 | 2013-08-01 18:00:09 | 68409 | 7 |
| 801XX | SERVER-01 | FOX | 4 | HOUSE | U6 | 45-54 YR | 2013-08-01 18:00:03 | 68403 | 2013-08-01 18:00:09 | 68409 | 7 |

Demographic Information - After

| GEO-GRAPHIC INFO | VIDEO SERVER INFO | CHAN-NEL INFO | VIEW-ING DEVICE | HOUSE | VIEWER | DEMO-GRAPHIC INFO | TUNE-IN DATE TIME | TUNE-IN SECOND | TUNE-OUT DATE TIME | TUNE-OUT SECOND | TUNE DURATION |
|---|---|---|---|---|---|---|---|---|---|---|---|
| 1270 | 1360 | 1230 | 1250 | 1240 | 1260 | 1280 | 1302 | 1304 | 1306 | 1308 | 1338 |
| 80111 | SERVER-01 | HIST | 1 | HOUSE | U1 | CHILD | 2013-08-01 18:00:00 | 64800 | 2013-08-01 18:00:05 | 64805 | 6 |
| 80112 | SERVER-01 | HISTHD | 2 | APT | U2 | CHILD | 2013-08-01 18:00:01 | 68401 | 2013-08-01 18:00:07 | 68407 | 7 |
| 80113 | SERVER-01 | DISC | 3 | OFFICE | U3 | CHILD | 2013-08-01 18:00:02 | 68402 | 2013-08-01 18:00:06 | 68406 | 5 |
| 80114 | SERVER-01 | ESPN | 3 | SCHOOL | U4 | CHILD | 2013-08-01 18:00:04 | 68404 | 2013-08-01 18:00:06 | 68406 | 3 |
| 801XX | SERVER-01 | FOX | 4 | HOUSE | U5 | ADULT | 2013-08-01 18:00:03 | 68403 | 2013-08-01 18:00:09 | 68409 | 7 |
| 801XX | SERVER-01 | FOX | 4 | HOUSE | U6 | ADULT | 2013-08-01 18:00:03 | 68403 | 2013-08-01 18:00:09 | 68409 | 7 |

FIG. 11 - Sample Data

Example 1:

Sample Data for LVA, DVR, VOD, EDU, LIV showing Program Information Translation

Program Information – Before

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1010 | 1020 | 1030 | 1040 | 1050 | 1060 | 1070 | 1080 | 1090 | 1100 | 1110 | 1120 | 1130 | 1140 | 1150 | 1160 | 1170 |
| SPORT | 1001-A | ESPN | H21 | D21 | V21 | DENV | 40-60k | LIN | 2013-08-31 | PL | 3 | 7 | 5 | NORM | SRV-01 | A+ |
| DOCU | 1002-A | HIST | H22 | D22 | V22 | DENV | 40-60k | LIN | 2013-08-31 | PL | 2 | 6 | 5 | NORM | SRV-01 | A+ |
| NATU | 1003-A | HIST | H23 | D23 | V23 | DENV | 40-60k | LIN | 2013-08-31 | PL | 1 | 7 | 7 | NORM | SRV-01 | A+ |
| NEWS | 1004-A | ABC | H24 | D24 | V24 | DENV | 40-60k | LIN | 2013-08-31 | PL | 3 | 6 | 4 | NORM | SRV-01 | A+ |
| SPORT | 1005-A | CBS | H25 | D25 | V25 | DENV | 40-60k | LIN | 2013-08-31 | PL | 4 | 12 | 9 | NORM | SRV-01 | A+ |

Program Information – After

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1210 | 1220 | 1230 | 1240 | 1250 | 1260 | 1270 | 1280 | 1290 | 1300 | 1310 | 1320 | 1330 | 1340 | 1350 | 1360 | 1370 |
| SPORT | 1001-A | ESPN | H21 | D21 | V21 | DENV | 40-60k | LIN | 2013-08-31 | PL | 3 | 7 | 5 | NORM | SRV-01 | A+ |
| OTHER | 1002-A | HIST | H22 | D22 | V22 | DENV | 40-60k | LIN | 2013-08-31 | PL | 2 | 6 | 5 | NORM | SRV-01 | A+ |
| OTHER | 1003-A | HIST | H23 | D23 | V23 | DENV | 40-60k | LIN | 2013-08-31 | PL | 1 | 7 | 7 | NORM | SRV-01 | A+ |
| OTHER | 1004-A | HIST | H24 | D24 | V24 | DENV | 40-60k | LIN | 2013-08-31 | PL | 3 | 6 | 4 | NORM | SRV-01 | A+ |
| SPORT | 1005-A | CBS | H25 | D25 | V25 | DENV | 40-60k | LIN | 2013-08-31 | PL | 4 | 12 | 9 | NORM | SRV-01 | A+ |

FIG. 11 - Sample Data – Continued

Example 2:

Sample Data for Linear Viewing Activity, DVR, VOD, EDU, LIV

Channel Example – Translating Channel Identifier to a Common Channel Identifier from normal and HD versions of the channel Channel Information – Before

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1010 | 1020 | 1030 | 1040 | 1050 | 1060 | 1070 | 1080 | 1090 | 1100 | 1110 | 1120 | 1130 | 1140 | 1150 | 1160 | 1170 |
| 1001 | 1001-A | HIST | H20 | D20 | V21 | DENV | 40-60k | LIN | 2013-08-31 | PL | 3 | 7 | 5 | NORM | SRV-01 | A+ |
| 1002 | 1002-A | HISTHD | H21 | D21 | V21 | DENV | 40-60k | LIN | 2013-08-31 | PL | 2 | 6 | 5 | NORM | SRV-01 | A+ |
| 1003 | 1003-A | FOX | H23 | D23 | V23 | DENV | 40-60k | LIN | 2013-08-31 | PL | 3 | 7 | 5 | NORM | SRV-01 | A+ |
| 1004 | 1004-A | FOXHD | H24 | D24 | V24 | DENV | 40-60k | LIN | 2013-08-31 | PL | 2 | 6 | 5 | NORM | SRV-01 | A+ |

Channel Information – After

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1210 | 1220 | 1230 | 1240 | 1250 | 1260 | 1270 | 1280 | 1290 | 1300 | 1310 | 1320 | 1330 | 1340 | 1350 | 1360 | 1370 |
| 1001 | 1001-A | HIST | H20 | D20 | V21 | DENV | 40-60k | LIN | 2013-08-31 | PL | 3 | 7 | 5 | NORM | SRV-01 | A+ |
| 1002 | 1002-A | HIST | H21 | D21 | V21 | DENV | 40-60k | LIN | 2013-08-31 | PL | 2 | 6 | 5 | NORM | SRV-01 | A+ |
| 1003 | 1003-A | FOX | H23 | D23 | V23 | DENV | 40-60k | LIN | 2013-08-31 | PL | 3 | 7 | 5 | NORM | SRV-01 | A+ |
| 1004 | 1004-A | FOX | H24 | D24 | V24 | DENV | 40-60k | LIN | 2013-08-31 | PL | 2 | 6 | 5 | NORM | SRV-01 | A+ |

FIG. 11 - Sample Data – Continued

Example 3:

Sample Data for Linear Viewing Activity, DVR, VOD, EDU, LIV

Channel Example – Translating Channel Identifier to a Common Channel Identifier and All OTHER Channel Information – Before

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1010 | 1020 | 1030 | 1040 | 1050 | 1060 | 1070 | 1080 | 1090 | 1100 | 1110 | 1120 | 1130 | 1140 | 1150 | 1160 | 1170 |
| PGM1 | PGM1AIR1 | HIST | H21 | D21 | V21 | DENV | 40-60k | DVR | 2013-08-31 | PL | 3 | 7 | 5 | NORM | SRV-01 | A+ |
| PGM1 | PGM1AIR1 | HISTHD | H22 | D22 | V22 | DENV | 40-60k | DVR | 2013-08-31 | PL | 2 | 6 | 5 | NORM | SRV-01 | A+ |
| PGM1 | PGM1AIR2 | DISC | H23 | D23 | V23 | DENV | 80-110K | DVR | 2013-08-31 | R1 | 7 | 11 | 5 | NORM | SRV-01 | A+ |
| PGM1 | PGM1AIR2 | ESPN | H24 | D24 | V24 | DENV | 80-110K | DVR | 2013-08-31 | R2 | 3 | 6 | 4 | NORM | SRV-01 | A+ |
| PGM1 | PGM1AIR2 | FOX | H25 | D25 | V25 | DENV | 80-110K | DVR | 2013-08-31 | PL | 4 | 15 | 12 | NORM | SRV-01 | A+ |

Channel Information – After

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1210 | 1220 | 1230 | 1240 | 1250 | 1260 | 1270 | 1280 | 1290 | 1300 | 1310 | 1320 | 1330 | 1340 | 1350 | 1360 | 1370 |
| PGM1 | PGM1AIR1 | HIST | H20 | D20 | V21 | DENV | 40-60k | DVR | 2013-08-31 | PL | 3 | 7 | 5 | NORM | SRV-01 | A+ |
| PGM1 | PGM1AIR1 | HIST | H21 | D21 | V21 | DENV | 40-60k | DVR | 2013-08-31 | PL | 2 | 6 | 5 | NORM | SRV-01 | A+ |
| PGM1 | PGM1AIR2 | OTHER | H23 | D23 | V23 | DENV | 80-110K | DVR | 2013-08-31 | R1 | 7 | 11 | 5 | NORM | SRV-01 | A+ |
| PGM1 | PGM1AIR2 | OTHER | H24 | D24 | V24 | DENV | 80-110K | DVR | 2013-08-31 | R2 | 3 | 6 | 4 | NORM | SRV-01 | A+ |
| PGM1 | PGM1AIR2 | OTHER | H25 | D25 | V25 | DENV | 80-110K | DVR | 2013-08-31 | PL | 4 | 15 | 12 | NORM | SRV-01 | A+ |

FIG. 11 - Sample Data – Continued

Example 4:

Sample Data for Linear Viewing Activity, DVR, VOD, EDU, LIV

House Example – Translating House Identifier to Common House Identifier and All other House Information – Before

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1010 | 1020 | 1030 | 1040 | 1050 | 1060 | 1070 | 1080 | 1090 | 1100 | 1110 | 1120 | 1130 | 1140 | 1150 | 1160 | 1170 |
| 1001 | 1001-A | HIST | HOUSE | D20 | V21 | DENV | 40-60k | VOD | 2013-08-31 | PL | 3 | 7 | 5 | NORM | SRV-01 | A+ |
| 1002 | 1002-A | HISTHD | APT | D21 | V21 | DENV | 40-60k | VOD | 2013-08-31 | PL | 2 | 6 | 5 | NORM | SRV-01 | A+ |
| 1003 | 1003-A | FOX | OFFICE | D23 | V23 | DENV | 40-60k | VOD | 2013-08-31 | PL | 3 | 7 | 5 | NORM | SRV-01 | A+ |
| 1004 | 1004-A | FOXHD | SCHOOL | D24 | V24 | DENV | 40-60k | VOD | 2013-08-31 | PL | 2 | 6 | 5 | NORM | SRV-01 | A+ |
| 1005 | 1005-A | DISC | HOUSE | D23 | V23 | DENV | 80-110K | VOD | 2013-09-01 | PL | 4 | 15 | 12 | NORM | SRV-01 | A+ |

House Information – After

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1210 | 1220 | 1230 | 1240 | 1250 | 1260 | 1270 | 1280 | 1290 | 1300 | 1310 | 1320 | 1330 | 1340 | 1350 | 1360 | 1370 |
| 1001 | 1001-A | HIST | HOUSE | D20 | V21 | DENV | 40-60k | VOD | 2013-08-31 | PL | 3 | 7 | 5 | NORM | SRV-01 | A+ |
| 1002 | 1002-A | HISTHD | OTHER | D21 | V21 | DENV | 40-60k | VOD | 2013-08-31 | PL | 2 | 6 | 5 | NORM | SRV-01 | A+ |
| 1003 | 1003-A | FOX | OTHER | D23 | V23 | DENV | 40-60k | VOD | 2013-08-31 | PL | 3 | 7 | 5 | NORM | SRV-01 | A+ |
| 1004 | 1004-A | FOXHD | OTHER | D24 | V24 | DENV | 40-60k | VOD | 2013-08-31 | PL | 2 | 6 | 5 | NORM | SRV-01 | A+ |
| 1005 | 1005-A | DISC | HOUSE | D23 | V23 | DENV | 80-110K | VOD | 2013-09-01 | PL | 4 | 15 | 12 | NORM | SRV-01 | A+ |

FIG. 11 - Sample Data – Continued

Example 5:

Sample Data for Linear Viewing Activity, DVR, VOD, EDU, LIV

Device Example – Translating Viewing Device Information to a Common Device Type and All Other Viewer Information – Before

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1010 | 1020 | 1030 | 1040 | 1050 | 1060 | 1070 | 1080 | 1090 | 1100 | 1110 | 1120 | 1130 | 1140 | 1150 | 1160 | 1170 |
| 1001 | 1001-A | HIST | H20 | STB | V21 | DENV | 40-60k | LIN | 2013-08-31 | PL | 3 | 7 | 5 | NORM | SRV-01 | A+ |
| 1002 | 1002-A | HISTHD | H21 | IPTV | V21 | DENV | 40-60k | LIN | 2013-08-31 | PL | 2 | 6 | 5 | NORM | SRV-01 | A+ |
| 1003 | 1003-A | FOX | H23 | TABLET | V23 | DENV | 40-60k | LIN | 2013-08-31 | PL | 3 | 7 | 5 | NORM | SRV-01 | A+ |
| 1004 | 1004-A | FOXHD | H24 | PHONE | V24 | DENV | 40-60k | LIN | 2013-08-31 | PL | 2 | 6 | 5 | NORM | SRV-01 | A+ |
| 1005 | 1005-A | DISC | H25 | STB | V23 | DENV | 80-110K | LIN | 2013-09-01 | PL | 4 | 15 | 12 | NORM | SRV-01 | A+ |

Viewer Information – After

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1210 | 1220 | 1230 | 1240 | 1250 | 1260 | 1270 | 1280 | 1290 | 1300 | 1310 | 1320 | 1330 | 1340 | 1350 | 1360 | 1370 |
| 1001 | 1001-A | HIST | H20 | STB | V21 | DENV | 40-60k | LIN | 2013-08-31 | PL | 3 | 7 | 5 | NORM | SRV-01 | A+ |
| 1002 | 1002-A | HISTHD | H21 | OTHER | V21 | DENV | 40-60k | LIN | 2013-08-31 | PL | 2 | 6 | 5 | NORM | SRV-01 | A+ |
| 1003 | 1003-A | FOX | H23 | OTHER | V23 | DENV | 40-60k | LIN | 2013-08-31 | PL | 3 | 7 | 5 | NORM | SRV-01 | A+ |
| 1004 | 1004-A | FOXHD | H24 | OTHER | V24 | DENV | 40-60k | LIN | 2013-08-31 | PL | 2 | 6 | 5 | NORM | SRV-01 | A+ |
| 1005 | 1005-A | DISC | H25 | STB | V23 | DENV | 80-110K | LIN | 2013-09-01 | PL | 4 | 15 | 12 | NORM | SRV-01 | A+ |

FIG. 11 - Sample Data – Continued

Example 6:

Sample Data for Linear Viewing Activity, DVR, VOD, EDU, LIV

Viewer Example – Translating Viewer Information from diverse values to a common value and all other Before

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1010 | 1020 | 1030 | 1040 | 1050 | 1060 | 1070 | 1080 | 1090 | 1100 | 1110 | 1120 | 1130 | 1140 | 1150 | 1160 | 1170 |
| 1001 | 1001-A | HIST | HOUSE | STB | PARENT | DENV | 40-60k | LIN | 2013-08-31 | PL | 3 | 7 | 5 | NORM | SRV-01 | A+ |
| 1002 | 1002-A | HISTHD | APT | IPTV | CHILD | DENV | 40-60k | LIN | 2013-08-31 | PL | 2 | 6 | 5 | NORM | SRV-01 | A+ |
| 1003 | 1003-A | FOX | HOUSE | TABLET | STUDENT | DENV | 40-60k | LIN | 2013-08-31 | PL | 3 | 7 | 5 | NORM | SRV-01 | A+ |
| 1004 | 1004-A | FOXHD | HOUSE | PHONE | PARENT | DENV | 40-60k | LIN | 2013-08-31 | PL | 2 | 6 | 5 | NORM | SRV-01 | A+ |
| 1005 | 1005-A | DISC | HOUSE | STB | CHILD | DENV | 80-110K | LIN | 2013-09-01 | PL | 4 | 15 | 12 | NORM | SRV-01 | A+ |

After

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1210 | 1220 | 1230 | 1240 | 1250 | 1260 | 1270 | 1280 | 1290 | 1300 | 1310 | 1320 | 1330 | 1340 | 1350 | 1360 | 1370 |
| 1001 | 1001-A | HIST | HOUSE | STB | PARENT | DENV | 40-60k | LIN | 2013-08-31 | PL | 3 | 7 | 5 | NORM | SRV-01 | A+ |
| 1002 | 1002-A | HISTHD | APT | IPTV | OTHER | DENV | 40-60k | LIN | 2013-08-31 | PL | 2 | 6 | 5 | NORM | SRV-01 | A+ |
| 1003 | 1003-A | FOX | HOUSE | TABLET | OTHER | DENV | 40-60k | LIN | 2013-08-31 | PL | 3 | 7 | 5 | NORM | SRV-01 | A+ |
| 1004 | 1004-A | FOXHD | HOUSE | PHONE | PARENT | DENV | 40-60k | LIN | 2013-08-31 | PL | 2 | 6 | 5 | NORM | SRV-01 | A+ |
| 1005 | 1005-A | DISC | HOUSE | STB | OTHER | DENV | 80-110K | LIN | 2013-09-01 | PL | 4 | 15 | 12 | NORM | SRV-01 | A+ |

FIG. 11 - Sample Data – Continued

Example 7:

Sample Data for Linear Viewing Activity, DVR, VOD, EDU, LIV

Geographic Example – Translating Geographic Information from a detailed value to a higher value Geographic Information – Before

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1010 | 1020 | 1030 | 1040 | 1050 | 1060 | 1070 | 1080 | 1090 | 1100 | 1110 | 1120 | 1130 | 1140 | 1150 | 1160 | 1170 |
| 1001 | 1001-A | HIST | H20 | D20 | V21 | 80111 | 40-60k | EDU | 2013-08-31 | PL | 3 | 7 | 5 | NORM | SRV-01 | A+ |
| 1002 | 1002-A | HISTHD | H21 | D21 | V21 | 80112 | 40-60k | EDU | 2013-08-31 | PL | 2 | 6 | 5 | NORM | SRV-01 | A+ |
| 1003 | 1003-A | FOX | H23 | D23 | V23 | 80113 | 40-60k | EDU | 2013-08-31 | PL | 3 | 7 | 5 | NORM | SRV-01 | A+ |
| 1004 | 1004-A | FOXHD | H24 | D24 | V24 | 80114 | 40-60k | EDU | 2013-08-31 | PL | 2 | 6 | 5 | NORM | SRV-01 | A+ |
| 1005 | 1005-A | DISC | H25 | D23 | V23 | 80115 | 80-110K | EDU | 2013-09-01 | PL | 4 | 15 | 12 | NORM | SRV-01 | A+ |

Geographic Information – After

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1210 | 1220 | 1230 | 1240 | 1250 | 1260 | 1270 | 1280 | 1290 | 1300 | 1310 | 1320 | 1330 | 1340 | 1350 | 1360 | 1370 |
| 1001 | 1001-A | HIST | H20 | D20 | V21 | 801XX | 40-60k | EDU | 2013-08-31 | PL | 3 | 7 | 5 | NORM | SRV-01 | A+ |
| 1002 | 1002-A | HISTHD | H21 | D21 | V21 | 801XX | 40-60k | EDU | 2013-08-31 | PL | 2 | 6 | 5 | NORM | SRV-01 | A+ |
| 1003 | 1003-A | FOX | H23 | D23 | V23 | 801XX | 40-60k | EDU | 2013-08-31 | PL | 3 | 7 | 5 | NORM | SRV-01 | A+ |
| 1004 | 1004-A | FOXHD | H24 | D24 | V24 | 801XX | 40-60k | EDU | 2013-08-31 | PL | 2 | 6 | 5 | NORM | SRV-01 | A+ |
| 1005 | 1005-A | DISC | H25 | D23 | V23 | 801XX | 80-110K | EDU | 2013-09-01 | PL | 4 | 15 | 12 | NORM | SRV-01 | A+ |

FIG. 11 - Sample Data – Continued

Example 8:

Sample Data for Linear Viewing Activity, DVR, VOD, EDU, LIV

Demographic Example – Translating Demographic Information from a detailed value to a higher value Demographic Information – Before

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1010 | 1020 | 1030 | 1040 | 1050 | 1060 | 1070 | 1080 | 1090 | 1100 | 1110 | 1120 | 1130 | 1140 | 1150 | 1160 | 1170 |
| 1001 | 1001-A | HIST | H20 | D20 | V21 | DENV | 1-3 YR | LIV | 2013-08-31 | PL | 3 | 7 | 5 | NORM | SRV-01 | A+ |
| 1002 | 1002-A | HISTHD | H21 | D21 | V21 | DENV | 4-5 YR | LIV | 2013-08-31 | PL | 2 | 6 | 5 | NORM | SRV-01 | A+ |
| 1003 | 1003-A | FOX | H23 | D23 | V23 | DENV | 6-8 YR | LIV | 2013-08-31 | PL | 3 | 7 | 5 | NORM | SRV-01 | A+ |
| 1004 | 1004-A | FOXHD | H24 | D24 | V24 | DENV | 4-5 YR | LIV | 2013-08-31 | PL | 2 | 6 | 5 | NORM | SRV-01 | A+ |
| 1005 | 1005-A | DISC | H25 | D23 | V23 | DENV | 21-44 YR | LIV | 2013-09-01 | PL | 4 | 15 | 12 | NORM | SRV-01 | A+ |
| 1006 | 1006-A | ABC | H26 | D26 | V26 | DENV | 45-54 YR | LIV | 2013-09-01 | PL | 4 | 15 | 12 | NORM | SRV-01 | A+ |

Demographic Information – After

| PRO-GRAM | PROGRAM AIRING | CHAN-NEL INFO | HOUSE | VIEWING DEVICE | VIEWER | GEO-GRAPHIC INFO | DEMO-GRAPHIC INFO | VIEWING TYPE | VIEWING DATE | PLAY-BACK MODE | PLAY-BACK BEGIN POSITION | PLAY-BACK END POSITION | ACTIVITY DURATION SECONDS | PRESENT-ATION INFO | VIDEO SERVER INFO | SYSTEM HEALTH INFO |
|---|---|---|---|---|---|---|---|---|---|---|---|---|---|---|---|---|
| 1210 | 1220 | 1230 | 1240 | 1250 | 1260 | 1270 | 1280 | 1290 | 1300 | 1310 | 1320 | 1330 | 1340 | 1350 | 1360 | 1370 |
| 1001 | 1001-A | HIST | H20 | D20 | V21 | DENV | CHILD | LIV | 2013-08-31 | PL | 3 | 7 | 5 | NORM | SRV-01 | A+ |
| 1002 | 1002-A | HISTHD | H21 | D21 | V21 | DENV | CHILD | LIV | 2013-08-31 | PL | 2 | 6 | 5 | NORM | SRV-01 | A+ |
| 1003 | 1003-A | FOX | H23 | D23 | V23 | DENV | CHILD | LIV | 2013-08-31 | PL | 3 | 7 | 5 | NORM | SRV-01 | A+ |
| 1004 | 1004-A | FOXHD | H24 | D24 | V24 | DENV | CHILD | LIV | 2013-08-31 | PL | 2 | 6 | 5 | NORM | SRV-01 | A+ |
| 1005 | 1005-A | DISC | H25 | D23 | V23 | DENV | ADULT | LIV | 2013-09-01 | PL | 4 | 15 | 12 | NORM | SRV-01 | A+ |
| 1006 | 1006-A | ABC | H26 | D26 | V26 | DENV | ADULT | LIV | 2013-09-01 | PL | 4 | 15 | 12 | NORM | SRV-01 | A+ |

FIG. 12
Summary Information

| Specification Name: | Prepared Video Viewing Activity Data File 160 |
|---|---|
| Record description: | The Prepared Video Viewing Activity Data File contains video viewing activity records resulting from either the Channel Translation Processor 150 or the Data Translation Processor 154 having processed the Video Viewing Activity Data File 130 and applying various translation rules to the file in order to create the Prepared Video Viewing Activity Data File which is ready for downstream processing.<br><br>These prepared records may be based on upon Linear Tuning Activity (LTA), sessionized linear viewing activity (LVA), digital video recording viewing activity (DVR), or video on demand viewing activity (VOD), Educational viewing activity (EDU), and Live (LIV) viewing. The Prepared Video Viewing Activity Data File 160 can hold any of these formats with the various fields being populated as needed. |

Data Structure

1200　　　　　　　　　　1202　　　1204　　1206
|　　　　　　　　　　　　　　|　　　　|　　　|
| NAME | TYPE | SIZE | DESCRIPTION |
|---|---|---|---|
| Notes: The `CHANNEL_INFO_TARGET 1400` field is shown below. This allows the analyst to see both the original Channel information and the enriched Channel information.<br><br>In FIG 3 I have shown the translated Channel value being appended to the file as field `CHANNEL_INFO_TARGET 1400` as shown here in FIG 12.<br><br>In FIG 4 I have shown that the value which is being replaced can be loaded to a field with the same name in the prepared file as in the source file such as is shown here in FIG 12. In an alternative embodiment, the analyst can define fields for each value that is being replaced so that the prepared (enriched) record layout would contain both the original value and the substituted value in each record. This would require additional space, but has the benefit of showing the original and translated values for audit and any other purpose that may require such values. ||||

FIG 12 Data Structure - Continued

| | | | | |
|---|---|---|---|---|
| 1210~ | PROGRAM_INFO | CHAR | 40 | The Program Information field.<br>See 1010 for definition. |
| 1220~ | PROGRAM_AIRING_INFO | CHAR | 40 | The Program Airing Information field.<br>See 1020 for definition. |
| 1230~ | CHANNEL_INFO | CHAR | 40 | The Channel Information field.<br>See 1030 for definition. |
| 1240~ | HOUSE_INFO | CHAR | 40 | The House Information field.<br>See 1040 for definition. |
| 1250~ | DEVICE_INFO | CHAR | 40 | The Device Information field.<br>See 1050 for definition. |
| 1260~ | VIEWER_INFO | CHAR | 40 | The Viewer Information field.<br>See 1060 for definition. |
| 1270~ | GEOGRAPHIC_INFO | CHAR | 40 | The Geographic Information field.<br>See 1070 for definition. |
| 1280~ | DEMOGRAPHIC_INFO | CHAR | 40 | The Demographic Information field.<br>See 1080 for definition. |
| 1290~ | VIEWING_TYPE | CHAR | 3 | The Viewing Type.<br>See 1090 for definition. |
| 1300~ | VIEWING_DATE | DATE | 8 | The Viewing Date.<br>See 1100 for definition. |
| 1302~ | TUNE_IN_DATE_TIME | DATE TIME | | The Tune in date time.<br>See 1102 for definition. |

FIG 12 Data Structure - Continued

| | | | | |
|---|---|---|---|---|
| 1304~ | TUNE_IN_SECOND_OF_DAY | Number | 5 | Tune In Second of Day. See 1104 for definition. |
| 1306~ | TUNE_OUT_DATE_TIME | DATE TIME | | Tune out date and time. See 1106 for definition. |
| 1308~ | TUNE_OUT_SECOND_OF_DAY | Number | 5 | Tune out Second of Day. See 1108 for definition. |
| 1310~ | PLAYBACK_MODE | CHAR | 2 | The Playback Mode. See 1110 for definition. |
| 1320~ | PLAYBACK_BEG_POSITION | Number | 5 | The Playback Begin Position. See 1120 for definition. |
| 1330~ | PLAYBACK_END_POSITION | Number | 5 | The Playback End Position. See 1130 for definition. |
| 1338~ | TUNE_DURATION_SECONDS | Number | 5 | Tune Duration Seconds. See 1138 for definition. |
| 1340~ | ACTIVITY_DURATION_SECONDS | Number | 5 | The Activity Duration. See 1140 for definition. |
| 1350~ | PRESENTATION_INFO | CHAR | 4 | The Presentation Information. See 1150 for definition. |
| 1360~ | VIDEO_SERVER_INFO | CHAR | 40 | The Video Server Information. See 1160 for definition. |
| 1370~ | SYSTEM_HEALTH_INFO | CHAR | 40 | The System Health Information. See 1170 for definition. |
| 1400~ | CHANNEL_INFO_TARGET | CHAR | 40 | Channel Information Target shows the translated value assigned to the channel information. As noted above, the translated value can be carried in the existing field or a new field can be added as shown here. |

DATA TRANSLATION FOR VIDEO-VIEWING ACTIVITY

CROSS-REFERENCE TO RELATED APPLICATIONS

This application is a continuation of U.S. application Ser. No. 14/037,352, filed Sep. 25, 2013 and now U.S. Pat. No. 11,627,356, which is hereby incorporated by reference in its entirety.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND—PRIOR ART

I have not found any relevant prior art at the present time.

BACKGROUND INFORMATION

General Statement of Problem

With the ever increasing number of consumer choices for television viewing, it is important for advertisers, content producers, and service providers such as cable television and satellite television and internet protocol television companies to be able to accurately measure audience viewership. I have discussed this problem extensively in my prior applications. In two of my previous Applications, I have taught how to use the MapReduce Framework to aggregate video viewing activity. When using that framework an analyst may find that certain aggregation functions consume a large quantity of computing resources but do not add value commensurate with that consumption of resources. This application teaches how to reduce the workload on the MapReduce Framework by implementing various data translation strategies prior to sending the video viewing activity file to downstream processes for measuring or aggregating Linear, DVR, and VOD Second-By-Second Video Viewing Activity. The reader will readily recognize that these aggregation strategies are applicable to a wide range of video content including, but not limited to, cable and/or satellite television video on demand, all variety of video content delivered electronically across a network, and online educational videos.

Existing Tools for Data Analysis

In my prior applications U.S. application Ser. No. 14/013,031 filed on Aug. 29, 2013 and U.S. application Ser. No. 14/020,778 filed on Sep. 6, 2013 I taught how to aggregate video viewing activity and video program viewing activity using the MapReduce Framework. I have not found any other teachings on this topic.

SUMMARY

In accordance with one embodiment, I disclose a computer-implemented method of using Linear, DVR, and VOD video viewing activity data as input to a data translation processor which prepares that video viewing activity for more efficient downstream processing by translating detailed values to aggregated values according to analyst defined translation rules in preparation for ingestion by a MapReduce Framework with the result that the MapReduce Framework needs to process less data in order to create analytical studies of second-by-second viewing activity for program, channel, house, device, viewer, demographic, and geographic attributes in combination or as individual attributes. Once the data translation rules have been applied to the video viewing activity by the data translation processor, the data is ready for use by downstream tools such as the MapReduce Framework which is able to aggregate the data much more efficiently than would have been possible prior to running the data translation processor. Additionally, by applying the translations to the video viewing activity file which contains all of the detailed values, this enables the analyst to use a single copy of that file for multiple analytical studies thus avoiding the time and cost associated with creating a new extract file with embedded translated values for each analytical study.

Advantages

By implementing the data translation processor that I teach about in this Application, an analyst can produce video viewing aggregations using the MapReduce distributed computing framework in less time using less computing resources. This will allow the analyst to aggregate larger data sets than would otherwise be possible using a given set of computer hardware. It will also allow the analyst to run additional studies thus potentially gaining additional insights into viewing behaviors.

Additionally, the analyst is able to save significant time and computing resources by avoiding the need to recreate the video viewing activity file with multiple data translations embedded in it because he does not need a new extract from the source system for each analytical study.

Definitions

The following are definitions that will aid in understanding one or more of the embodiments presented herein:

Computer readable format means any data format that can be read by a computer program or a human being as necessary. Nonlimiting examples include:
 (i) formatted text files,
 (ii) pipe delimited text files,
 (iii) data base tables,
 (iv) Extensible Markup Language (XML) messages,
 (v) a printed report,
 (vi) JavaScript Object Notation messages.

Data analysis computer system means a combination of one or more computers on which a Data Translation Program or Programs can be executed. Nonlimiting examples include:
 (i) one or more computers where video viewing activity data can be used as input to a process which creates prepared video viewing activity data.

Data analysis computer of known type means any commonly available computer system running a commonly known operating system. Nonlimiting examples include:
 (i) a standard personal computer running WINDOWS 7 Professional operating system from MICROSOFT® Corporation,
 (ii) a computer running the UNIX operating system,
 (iii) a computer running the Linux operating system,
 (iv) a computer in a cloud computing environment,
 (v) a mainframe computer with its operating system.

Data translation program means a computer program or programs that are able to execute on a Data analysis computer of known type. Nonlimiting examples include:

(i) a JAVA program, (ii) a Python script, (iii) a COBOL program.

Demographic information means any data item that can describe a characteristic of a viewer or a subscriber or a household associated with a viewer who is operating the video asset viewing device. Non-limiting examples include income, ethnicity, gender, age, marital status, location, geographic area, postal code, census data, occupation, social grouping, family status, any proprietary demographic grouping, segmentation, credit score, dwelling type, homeownership status, property ownership status, rental status, vehicle ownership, tax rolls, credit card usage, religious affiliation, sports interest, political party affiliation, cable television subscriber type, cable television subscriber package level, and cell phone service level.

Device Characteristic means any feature or capability or aspect or descriptive qualifier or identifier of a video viewing device. Nonlimiting examples include that this may identify the type of device such as a set-top box, a tablet, a smart phone; a capability of the device such as the ability to record video or to support multiple viewing windows, or a manufacturer identifier.

Device Type is a subset of Device Characteristic where device type may, as a nonlimiting example, identify the type of device such as a set-top box, a tablet, a smart phone.

Digital Video Recorder means a device that records video content from a network for later playback. This includes but is not limited to set-top box DVR, network DVR, and cloud DVR.

DVR—see Digital Video Recorder.

Digital Video Recording (DVR) Playback is when the viewer plays back content that was previously recorded on their DVR. DVR content can be viewed using various Trick Play features.

Geographic information means any service area or any network hierarchy designation or marketing area or other designated area used by a cable television company or a satellite television company or IP Television delivery company or educational service provider or video asset delivery system. The boundary or description of a geographic area is defined based on the needs of the service provider. Nonlimiting examples include a Market in a cable company network, a Headend in a cable company network, a Hub in a cable company network, a census tract, a cell tower identifier, a service area for satellite TV, advertising zone, a zip code, or some other geographic identifier. The geographic information may then be used to identify the location of a video asset viewing device or geographic information about the about the house associated with the device or the location of the device at the time of the viewer interaction in the event that the viewer interaction occurs in a location different than the location of the house associated with the device.

Network means any computer network. Nonlimiting examples include:
  (i) a cable television network,
  (ii) a cellular telephony network,
  (iii) hybrid fiber coax system,
  (iv) a satellite television network,
  (v) a wi-fi network,
  (vi) any means that supports communication among video asset viewing devices or electronic devices or computers or computer systems.

Pipe delimited text files means data files where the fields are separated by the "|" character.

New form of said video viewing activity data means the prepared version of the Video Viewing Activity Data File.

Sessionized Linear Viewing is linear tuning activity which has been transformed into program based viewing. A simple linear tuning event may cross program boundaries. That simple linear tuning event can be split into multiple program based linear viewing activity records by creating separate tuning records for each program that is viewed during the linear tuning event. The viewer may use "trick plays" when viewing this content. Additionally, the sessionized linear viewing may represent live viewing activity or time shifted viewing activity.

Set-top box means a video asset viewing device that receives external signals and decodes those signals into content that can be viewed on a television screen or similar display device. The signals may come from a cable television system, a satellite television system, a network, or any other suitable means. A set-top box may have one or more tuners. The set-top box allows the user to interact with it to control what is displayed on the television screen. The set-top box is able to capture the commands given by the user and then transmit those commands to another computer system. For purposes of this application, stating that a set-top box tunes to a channel is equivalent to stating that a tuner in a set-top box has tuned to a channel. A set-top box may also play back previously recorded video content.

STB means Set-top box.

Trick Play means using features of the video viewing device to execute operations such as Play, Fast Forward at various speeds (1×, 2×, 3×, 4×), Pause, Skip, Reverse at various speeds (1×, 2×, 3×, 4×), Slow play, slow reverse, and similar activities.

Tuner means a tuner in a Set-top box.

Tuner index means an identifier of a tuner in a Set-top box.

Video On Demand (VOD) a video service whereby previously recorded video content is made available for viewing. VOD content can be viewed using various Trick Play features. The content may include, but is not limited to, cable and/or satellite television video on demand, all variety of video content delivered electronically across a network, and online educational videos.

Video asset means any programming content that may be viewed and/or heard. A Video Program may contain multiple Video Assets. Nonlimiting examples of Video Asset include:
  (i) advertisements or commercials, (ii) movies, (iii) sports programs, (iv) news casts, (v) music,
  (vi) television programs, (vii) video recordings.

Video asset viewing device means any electronic device that may be used either directly or indirectly by a human being to interact with video content where the video content is provided by a cable television system or a satellite television system or a computer system accessed through a network. Nonlimiting examples include: Gaming station, web browser, MP3 Player, Internet Protocol phone, Internet Protocol television, mobile device, mobile smart phone, set-top box, satellite television receiver, set-top box in a cable television network, set-top box in a satellite television system, cell phone, personal communication device, personal video recorder, personal video player, two-way interactive service platforms, personal computer, tablet device.

Video server delivering video content through a network means any computer system, any individual piece of computer equipment or electronic gear, or any combination of computer equipment or electronic gear which enables or facilitates the viewer interaction with the video asset viewing device. Nonlimiting examples include:
  (i) cable television system, (ii) cable television switched digital video system, (iii) cellular phone network, (iv) satellite television system, (v) web server,
(vi) any individual piece of computer equipment or electronic gear,
(vii) any combination of computer equipment or electronic gear.

Video viewing activity means any identifiable activity that a Video asset viewing device operator may do in regard to a Video asset viewing device and where such activity can be captured by the video asset viewing device or by the video server delivering video content through a network that supports the device. Nonlimiting examples include:
  (i) power on/power off, open web page, close web page,
  (ii) channel up/channel down/channel selection, play video content on web browser,
  (iii) volume up/volume down/mute/unmute,
  (iv) any trick play such as fast forward, rewind, pause
  (v) recording video content,
  (vi) playing back recorded video content,
  (vii) invoking a menu, choosing a menu option,
  (viii) any response to a screen prompt
  (ix) playing live video content.

Viewer means the human being causing a Viewer interaction; the user of a Set-top box or a Video asset viewing device.

BRIEF DESCRIPTION OF THE DRAWINGS

The present disclosure is illustrated by way of example and not limited in the accompanying figures in which like reference numerals indicate similar elements and in which:

FIG. 3 depicts an illustrative block diagram of workstations and servers that may be used to implement the processes and functions of certain aspects of the present disclosure in accordance with one or more example embodiments.

FIG. 4 shows a flowchart for provisioning and enabling a user to obtain service by an application on an associated computing component in accordance with one or more example embodiments.

FIG. 5 depicts an illustrative computing environment for provisioning a group or user for service provided by an application on an associated computing component in accordance with one or more example embodiments.

FIG. 6 depicts an illustrative computing environment for batch process for enabling a user to obtain service by an application on an associated computing component in accordance with one or more example embodiments.

FIG. 7 depicts an illustrative event sequence for provisioning a group or user for service provided by an application on an associated computing component in accordance with one or more example embodiments.

FIG. 8 depicts an illustrative event sequence for obtaining a security token for service by an application on an associated computing component in accordance with one or more example embodiments.

FIG. 9 depicts an illustrative event sequence for obtaining a service ticket for service by an application on an associated computing component in accordance with one or more example embodiments.

FIG. 10 shows a flowchart for provisioning a group or user for obtaining service by an application on an associated computing component in accordance with one or more example embodiments.

FIG. 11 shows a flowchart for batch process for enabling a user to obtain service by an application on an associated computing component in accordance with one or more example embodiments.

FIG. 12 shows a flowchart for setup script in accordance with one or more example embodiments.

DETAILED DESCRIPTION OF THE DRAWINGS

Figure 1:
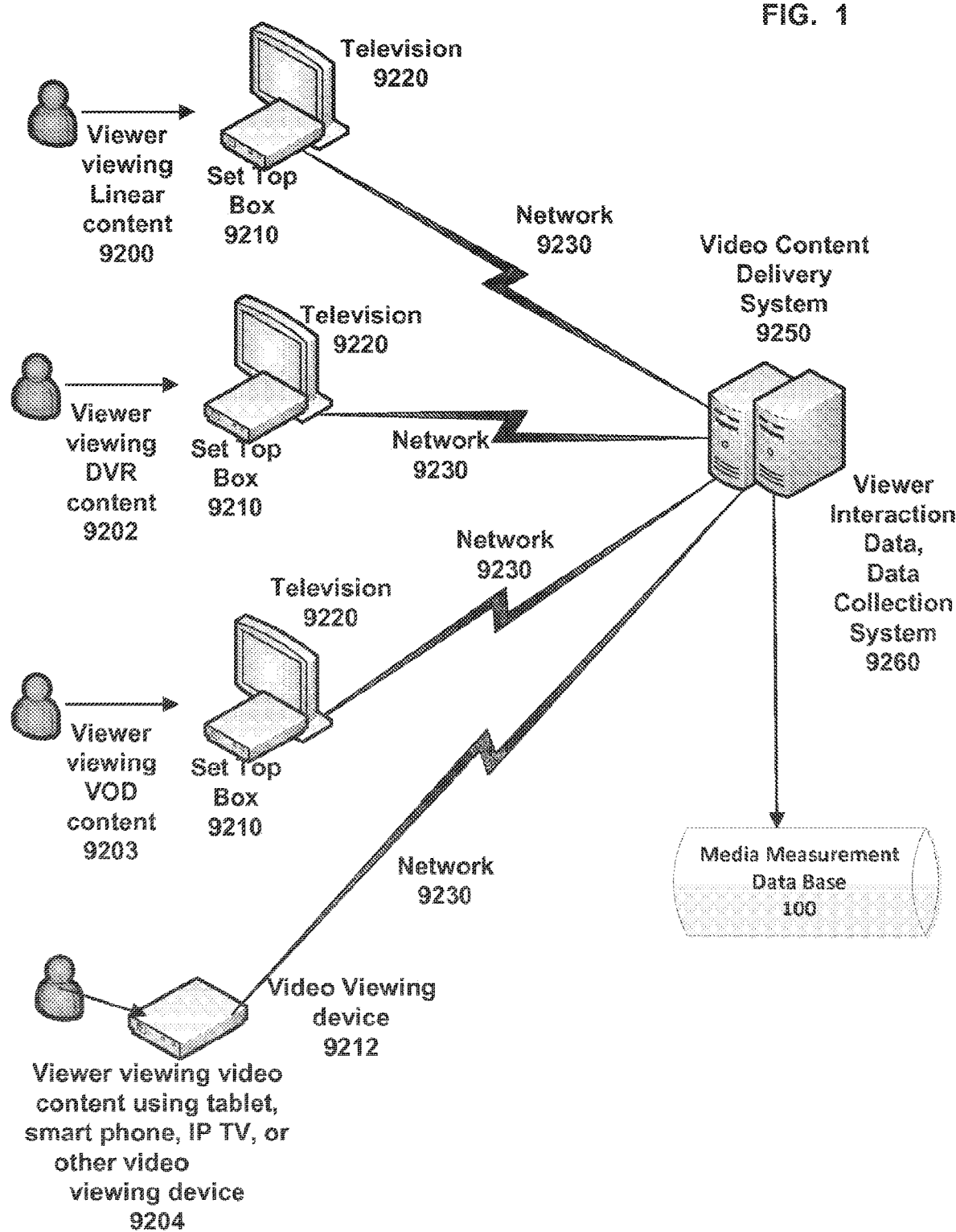
FIG. 1 depicts a computing system having a primary computing component and one or more associated computing components in accordance with one or more example embodiments.

When reading the information below, it can be appreciated that these are merely samples of table layouts, format and content, and many aspects of these tables may be varied or expanded within the scope of the embodiment. The table layouts, field formats and content, algorithms, and other aspects are what I presently contemplate for this embodiment, but other table layouts, field formats and content, algorithms, etc. can be used. The algorithms are samples and various aspects of the algorithms may be varied or expanded within the scope of the embodiment.

In one embodiment the Channel Translation Processor 150 and the Data Translation Processor 154 can be implemented on computer clusters accessing a distributed file system under the Linux operating system. The Channel Translation Processor 150 and the Data Translation Processor 154 can each be implemented in JAVA or Python or COBOL or various other languages. Those skilled in the art will readily recognize these tools.

Note on Media Measurement Data Model

Cable Television Laboratories, Inc. has published an "Audience Data Measurement Specification" as "OpenCable™ Specifications, Audience Measurement, Audience Measurement Data Specification" having Document Control Number "OC-SP-AMD-101-130502" copyright© Cable Television Laboratories, Inc. 2013 which describes a Media Measurement Data Model (MMDM) database design which can be used as a source of data for both Channel Translation.

Processor 150 and the Data Translation Processor 154 which I teach how to build in this application. The teaching in my present application can be implemented in conjunction with that Media Measurement Data Model or with any number of data models as long as the required input data is provided as described herein.

Note: Numbering in the Drawings—The numbers in the drawings are usually, but not always, in sequential order.

FIG. 1 provides an overview of an exemplary process for collecting viewer interaction data derived from a plurality of viewers interacting with video content that was delivered on a plurality of video asset viewing devices delivering content through a network and then loading that data to a Media Measurement Data Base 100. This figure illustrates several viewers interacting with video asset viewing devices to view content which was delivered to those devices across a network and then to collect viewing activity from those devices.

In this nonlimiting example, the purpose is not to describe in detail the operations of a video content delivery network or a data collection process, but simply to show how the data that is collected from that system can be made available to my Channel Translation Processor 150 or my Data Translation Processor 154.

It begins with Viewer Viewing Linear Content 9200 who is interacting with a set-top box 9210 and television 9220 as he views linear content. The set-top box 9210 interacts with a Video Content Delivery System 9250 which delivers the content across a Network 9230.

It continues with Viewer Viewing DVR Content 9202 who is interacting with a set-top box 9210 and television 9220 as he interacts with DVR content, recording content and playing back recorded content using various modes including trick plays. The set-top box 9210 interacts with a Video Content Delivery System 9250 which delivers the content across a Network 9230.

It continues with Viewer Viewing VOD Content 9203 who is interacting with a set-top box 9210 and television 9220 as he interacts with VOD content, playing the content using various modes including trick plays. The set-top box 9210 interacts with a Video Content Delivery System 9250 which delivers the content across a Network 9230.

It continues with Viewer viewing video content using tablet, smart phone, IP TV, or other video viewing device 9204 who is interacting with a variety of Video Viewing Devices 9212, including but not limited to tablet, smart phone, IP TV, PC, etc. The video viewing device interacts with a Video Content Delivery System 9250 which delivers the content across a Network 9230.

Video Content Delivery System 9250 then interacts with a Viewer Interaction Data, Data Collection System 9260 which collects all manner of viewer interaction data including Linear viewing including time-shifted linear viewing, Digital Video Recorder recording and playback/viewing, Video on Demand viewing, Educational video viewing, Streaming video viewing, and Live viewing. The Viewer Interaction Data, Data Collection System 9260 then processes the data as needed to load it to a Media Measurement Data Base 100. The data in the Media Measurement Data Base 100 can then be used as input to creating the Video Viewing Activity Data File 130, as described in FIG. 2.

Figure 2:
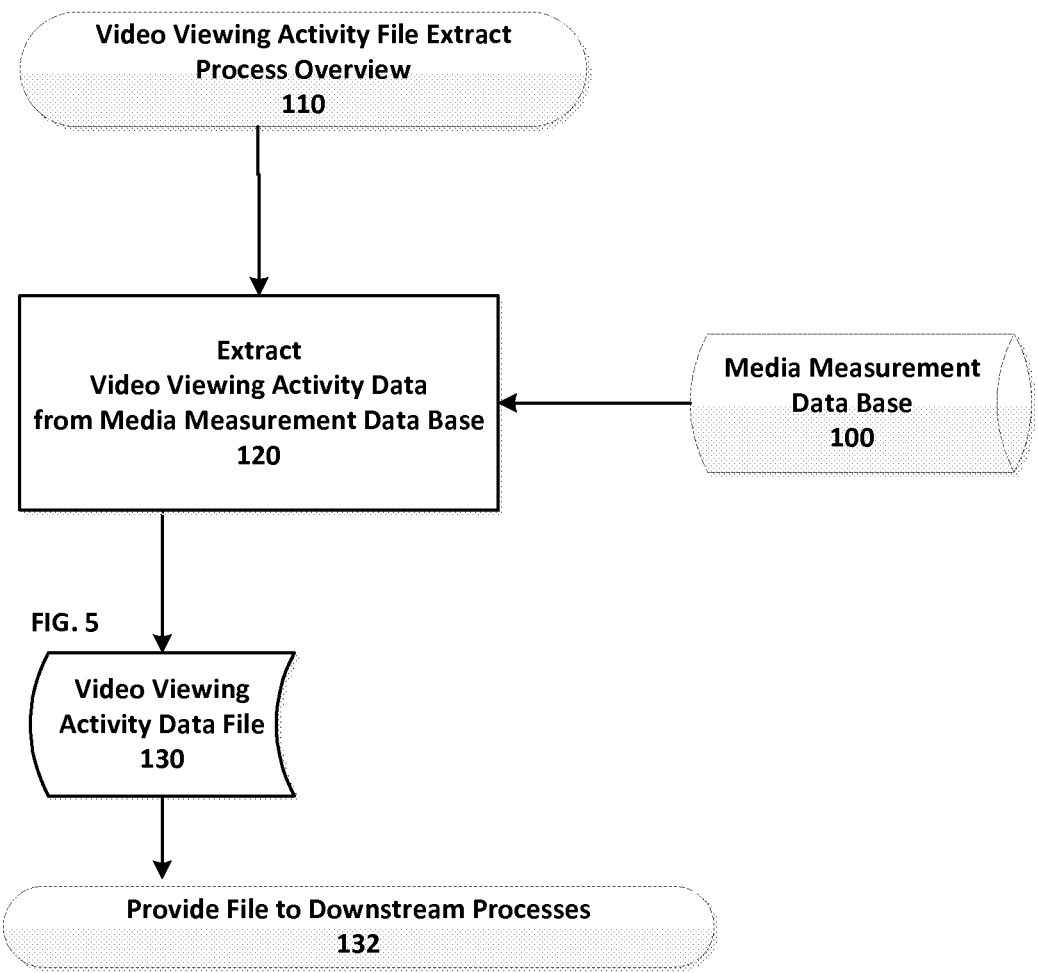
FIG. 2 depicts an illustrative operating environment in which various aspects of the disclosure may be implemented in accordance with one or more example embodiments.

FIG. 2 illustrates an overview of the process for creating the Video Viewing Activity Data File 130. The process of extracting this file from the Media Measurement Database 100 is often an expensive operation. For this reason, an analyst may wish to create this file in a somewhat generalized format with numerous detail fields and then store the file on a distributed file system in preparation for running a variety of analytical processes against the file.

As a non-limiting example, a file of Video Viewing Activity Data may be used to analyze viewing in numerous dimensions such as:
  (i) program information, (ii) channel information, (iii) house information,
  (iv) device information, (v) viewer information, (vi) geographic information,
  (vii) demographic information.

To provide a number of non-limiting examples, for program information, the analyst may need to:
  a) Analyze sports viewing vs. all other viewing
  b) Analyze News viewing vs. sports viewing
  c) Analyze Sports viewing vs. movie viewing
  d) Analyze "G" program viewing vs. all other viewing.

To provide a number of non-limiting examples, for channel information, the analyst may need to:
  a) Analyze standard definition viewing vs. high definition viewing of a channel
  b) Analyze all standard definition viewing vs. all high definition viewing
  c) Combine standard definition viewing and high definition viewing to measure that
  d) Analyze combined standard definition viewing and high definition viewing of one channel vs. all other channels.

To provide a number of non-limiting examples, for house information, the analyst may need to:
  a) Analyze residential viewing vs. commercial viewing
  b) Analyze house viewing vs. apartment (multi-family) viewing.

To provide a number of non-limiting examples, for device information, the analyst may need to:
  a) Analyze STB viewing vs. all other viewing
  b) Analyze STB viewing vs. tablet viewing.

To provide a number of non-limiting examples, for viewer information, the analyst may need to:
  a) Analyze viewing by viewer type such as parent vs. student
  b) Analyze viewing by grade level.

To provide a number of non-limiting examples, for geographic information, the analyst may need to:
  a) Analyze viewing by a combination of zip codes
  b) Analyze viewing by one marketing area compared to another marketing area.

To provide a number of non-limiting examples, for demographic information, the analyst may need to:
  a) Analyze viewing by a combination of age levels
  b) Analyze viewing by one education level vs. another education level
  c) Analyze viewing by one education level vs. all other education levels.

In addition to all of these possibilities, an analyst may combine any number of these qualifiers. To provide a number of non-limiting examples, for demographic information, the analyst may need to:
  a) Analyze viewing of a channel by a combination of age levels
  b) Analyze viewing of a channel by device types
  c) Analyze viewing by a program by demographic groups
  d) Analyze viewing by a program by demographic groups by device types.

In each of the examples above, the analyst may be able to take the same Video Viewing Activity Data File 130 that was extracted from the Media Measurement Database 100 and use it, with various enrichments, to feed into a MapReduce process where he can aggregate the data using hundreds or even thousands of computers working in parallel. Those skilled in the art will readily recognize that when there are fewer unique keys to aggregate using MapReduce, the MapReduce process will consume fewer resources, thus allowing the analyst to complete more studies in less time with less computing resources.

To explain this further, in my pending applications U.S. application Ser. No. 14/013,031 filed on Aug. 29, 2013 and U.S. application Ser. No. 14/020,778 filed on Sep. 6, 2013 I taught how to use the MapReduce distributed computing framework to analyze video viewing activity. In those applications I taught how to explode the video viewing activity so that one record is created for each second of viewing activity for each incoming record.

If an analyst was analyzing 3600 seconds of viewing across 100 channels, this could potentially lead to 3600*100=360,000 unique keys in the Reduce part of the MapReduce process. However, if the analyst knew in advance that he was only interested in detailed viewing information for 10 channels and all the other activity could be grouped into an "OTHER" bucket, then this could potentially lead to 3600*11=39,600 unique keys in the Reduce part of the MapReduce process. This is a very large reduction in the unique key count which results in a significant reduction in run time and computing resources needed to run the analysis.

Similarly, suppose there is a cable system with 300 channels. If an analyst was interested in analyzing the viewing activity of 20 channel across the entire day of 86,400 seconds, he would likely still need to measure the viewing activity of all the other 280 channels, perhaps to be able to calculate the percentage of the overall viewing activity at any second of the day for each of the 20 channels. In this case assume the analyst is not interested in the activity of those other channels except to have an accurate count of total viewing during any second of the day. If the analyst simply aggregated the incoming data as it is, the result could potentially be 300*86,400=25,920,000 unique keys in the Reduce part of the MapReduce process. By grouping the viewing activity of the 280 channels into an "OTHER" bucket, then this could potentially lead to 86,400*21=1,814,400 unique keys in the Reduce part of the MapReduce process. This is a very large reduction in the unique key count which results in a significant reduction in run time and computing resources needed to run the analysis.

This same thought process applies to program information, house information, device information, viewer information, geographic information, and demographic information. Thus we see that the same extract file can be used in a multitude of analytical processes if the analyst is able to apply some pre-aggregation rules to the file to create a Prepared Video Viewing Activity Data File. In the remainder of this specification I will teach how to create such an Prepared Video Viewing Activity Data File which can then be provided to downstream analytic processes such as the Data Explosion Process described in my previous Applications.

Before resuming the review of FIG. 2, note that the video viewing activity may be sourced from a Media Measurement Database such as the one described in the Cable Television Laboratories, Inc. specification. The populating of the Media Measurement Database 100 is beyond the scope of this application and so only brief remarks will be made in reference to that. There are video viewing data collection systems that are commonly used in the industry for collecting channel tuning or video viewing activity data including switched digital video systems, set top box applications, internet protocol video viewing applications, and other video viewing applications. I have discussed these in detail in my prior applications. These systems enable the collection of the video viewing events which can be loaded to a Media Measurement Database 100. From such a database, Video Viewing Activity Data can be extracted in a format similar to that shown in FIG. 5 Video Viewing Activity Data File 130.

Also before resuming the review of FIG. 2, it is helpful to recognize that creating the Video Viewing Activity Data file is often a time consuming operation. It can be one of the slower tasks in the entire chain of events in analyzing the video viewing activity. For this reason, it is helpful to avoid multiple or repeated data extraction processes. One solution to this problem is to extract a single file which contains all of the video viewing activity in a detailed format (with numerous fields), perhaps on a daily basis for the previous day's viewing activity, and then save that detailed file on a distributed file system. Then that detail file can be used as input to a translation process such as I describe herein where the detailed values are translated to or replaced by summary values as needed to perform the analytical study of interest. By designing the system in this way, the analyst can take advantage of the power of massively parallel systems to create analytical studies very quickly.

Proceeding with the review of FIG. 2, the process begins with Video Viewing Activity File Extract Process Overview 110. The first step is to extract the video viewing events as per Extract Video Viewing Activity Data from Media Measurement Data Base 120. Those skilled in the art will have no difficultly creating a database query or similar process to extract data from a Media Measurement Database 100 or other source and making it available in a format similar to that defined in Video Viewing Activity Data File 130. The file structure is defined in FIG. 5 Video Viewing Activity Data File 130 which describes an exemplary format for the input video viewing activity data.

This data file may contain various types of viewing activity depending on the query defined by the analyst. A non-limiting example of the types are:
  a) Linear tuning activity (LTA)
  b) Sessionized linear viewing activity (LVA)
  c) Digital video recording viewing activity (DVR)
  d) Video on demand viewing activity (VOD)
  e) Education video viewing activity (EDU)
  f) Live viewing activity (LIV).

These are defined next:

Linear tuning activity (LTA)—Linear Tuning Activity is tuning activity which is based on linear tuning events where the viewer tunes to a channel, stays on the channel for some period of time (one second to multiple hours), and then tunes away by tuning to another channel or by initiating some other activity. Linear Tuning Activity may cross program boundaries.

Sessionized linear viewing activity (LVA)—Sessionized linear viewing activity may be derived from linear tuning events or it may be captured by the set top box as sessionized activity. For linear tuning events which fit within program boundaries, the tuning event may be enriched as described in the Cable Television Laboratories, Inc. specification. For linear tuning events which cross program boundaries, the tuning event is divided into shorter duration tuning events as needed to fit within program boundaries as described in the specification; the tuning events are also enriched with additional fields. Because the viewing activity has been transformed to fit within program boundaries, I refer to it as program-based viewing. Linear viewing activity may be extracted from the Cable Television Laboratories, Inc. MMDM or from any source that is able to provide the data in a format suitable for this process.

A non-limiting example will help to explain this:

Device 100 has a linear tuning event consisting of a Tune to ABC at 6:55:00 PM and tune away from ABC at 8:07:59 PM. Assume a program schedule on ABC of News from 6:30:00 PM to 6:59:59 PM, followed by Action Show from 7:00:00 PM to 7:59:59 PM, followed by Sports Show from 8:00:00 PM to 8:29:59 PM. Using this sample data set, we see that the linear tuning event from Device 100 can be sessionized as follows:
  i. Session 1: Channel ABC from 6:55:00 PM to 6:59:59 PM tuned to Program 'News'.
  ii. Session 2: Channel ABC from 7:00:00 PM to 7:59:59 PM tuned to Program 'Action Show'.
  iii. Session 3: Channel ABC from 8:00:00 PM to 8:07:59 PM tuned to Program 'Sports Show.'

This is defined in more detail in the specification that Cable Television Laboratories, Inc. has published as "Audience Data Measurement Specification" referred to previously.

The same video content may air multiple times, so when viewing is being measured it is necessary to track the Program information, Program Airing information, and Channel information along with other fields.

Digital video recording viewing activity (DVR)—DVR viewing activity may be extracted from the Cable Television Laboratories, Inc. MMDM or from any source that is able to provide the data in a format suitable for this process. As a non-limiting example, a PROGRAM may be a baseball game and a PROGRAM_AIRING may be the initial airing of the game followed by a replay later that day (thus two airings). Because a DVR recording is a recording of a video asset that airs on a certain channel at a certain time, DVR assets are also linked with Channel.

When the viewer records a program, they may record any of several airings. Also the program my air on different channels for the original and the replay. For these reasons, the DVR recording and subsequent playback must identify the Program information, Program Airing information, and Channel information along with other fields.

Video on demand viewing activity (VOD)—VOD viewing activity is extracted from the Cable Television Laboratories, Inc. MMDM or from any source that is able to provide the data in a format suitable for this process. As a non-limiting example, a program may be any VOD asset, a movie, a sporting event, an online class, etc. The concept of a PROGRAM_AIRING does not apply to VOD. As to channel, because a VOD Program airs on the preassigned VOD channel, the channel information is not particularly informative in the context of VOD, so it is ignored for purposes of this Application.

Educational viewing activity (EDU)—EDU viewing activity is similar to VOD viewing in that a pre-recorded program is being viewed. This may be an educational video or any other type of video file. EDU viewing activity is often gathered from a web page that has been instrumented to capture this kind of activity.

Live viewing activity (LIV)—LIV viewing activity is any kind of live streaming video activity. LIV viewing activity is often gathered from a web page or cable TV network or satellite TV network that has been instrumented to capture this kind of activity.

Viewing types LVA, DVR, VOD, and EDU all share the characteristic that for measurement purposes, the measuring activity must be based on position in the content rather than a time element such as UTC time or local time. Measuring viewing activity based on position in the content enables creation of metrics having the same basis across LVA, DVR, VOD, and EDU viewing. Furthermore, when measuring based on position in the content, it is necessary to use a fixed reference point such as the actual start of the content. To illustrate, for a DVR recording, not every viewer will record the content beginning at the start of the program. So using position in the recording for measurement would not yield comparable results. Instead it is required to use a fixed reference point (the start of the content), in the actual content, not the start of the recording, and measure viewing from that fixed reference point. Using a fixed reference point enables consistent measurement regardless of whether the user begins recording at the beginning or some other point in the content. The same concept is applicable to LVA and VOD and EDU viewing. This is why position related fields are included in FIG. 5.

Resuming with the review of FIG. 2, those with ordinary skill in the art will readily recognize how to create the Video Viewing Activity Data File 130 (FIG. 5). Note that there is a single record layout for all the record types. Fields which are not used may be left blank.

Once the Video Viewing Activity Data File 130 has been written to the distributed file system it is ready for use by downstream processes such as my Translation Processors.

Depending on the criteria which the analyst intends to use in aggregating the data, various fields can be omitted from the Video Viewing Activity Data File 130 file because the MapReduce process will not use them. I have included these additional fields to provide a comprehensive picture recognizing that one can always drop the fields that they choose not to use.

FIG. 3 illustrates an exemplary process for enriching the Video Viewing Activity Data File 130 with channel information. I present two alternatives: (a) loading the channel information translation table from a flat file into the memory of the computer running the Channel Translation Processor 150, and (b) performing a join operation using channel information translation data from a database table.

The process begins with Channel Enrichment Process Overview 120.

The Channel Translation Processor 150 requires several steps:

Step 1:

Load the Channel Information Translation Table as flat file 140 into the memory of the computer in a lookup table. This file can be presented to the Channel Translation Processor 150 as a csv file which is then read and loaded to an array in the memory of the computer. A read loop such as the following can be used to load this table:

```
Move 0 to sub
Execute Read Loop until end of file
Read loop
    Read Channel Information Translation Table as flat file 140
    If end of file
        exit loop
    Else
        Add 1 to sub
        move SOURCE_CHANNEL_INFORMATION_IN 1810
            to CHAN-MAP-CHAN-INFO-SOURCE(sub) 1910
        move TARGET_CHANNEL_INFORMATION_IN 1820
            to CHAN-MAP-CHAN-INFO-TARGET(sub) 1920
    end-if
end loop
```

Step 2:

Process the Video Viewing Activity Data File 130 using a read loop as follows:

```
Execute Read Loop until end of file
Read Loop
    Read Video Viewing Activity Data File 130
    If end of file
        exit loop
    Else
        MOVE PROGRAM_INFO              1010 TO PROGRAM_INFO         1210
        MOVE PROGRAM_AIRING_INFO       1020 TO PROGRAM_AIRING_INFO  1220
        MOVE CHANNEL_INFO              1030 TO CHANNEL_INFO         1230
```

```
    MOVE HOUSE_INFO                     1040 TO HOUSE_INFO                    1240
    MOVE DEVICE_INFO                    1050 TO DEVICE_INFO                   1250
    MOVE VIEWER_INFO                    1060 TO VIEWER_INFO                   1260
    MOVE GEOGRAPHIC_INFO                1070 TO GEOGRAPHIC_INFO               1270
    MOVE DEMOGRAPHIC_INFO               1080 TO DEMOGRAPHIC_INFO              1280
    MOVE VIEWING_TYPE                   1090 TO VIEWING_TYPE                  1290
    MOVE VIEWING_DATE                   1100 TO VIEWING_DATE                  1300
    MOVE TUNE_IN_DATE_TIME              1102 TO TUNE_IN_DATE_TIME             1302
    MOVE TUNE_IN_SECOND_OF_DAY          1104 TO TUNE_IN_SECOND_OF_DAY         1304
    MOVE TUNE_OUT_DATE_TIME             1106 TO TUNE_OUT_DATE_TIME            1306
    MOVE TUNE_OUT_SECOND_OF_DAY         1108 TO TUNE_OUT_SECOND_OF_DAY        1308
    MOVE PLAYBACK_MODE                  1110 TO PLAYBACK_MODE                 1310
    MOVE PLAYBACK_BEG_POSITION          1120 TO PLAYBACK_BEG_POSITION         1320
    MOVE PLAYBACK_END_POSITION          1130 TO PLAYBACK_END_POSITION         1330
    MOVE TUNE_DURATION_SECONDS          1138 TO TUNE_DURATION_SECONDS         1338
  MOVE ACTIVITY_DURATION_SECONDS        1140 TO ACTIVITY_DURATION_SECONDS     1340
    MOVE PRESENTATION_INFO              1150 TO PRESENTATION_INFO             1350
    MOVE VIDEO_SERVER_INFO              1160 TO VIDEO_SERVER_INFO             1360
    MOVE SYSTEM_HEALTH_INFO             1170 TO SYSTEM_HEALTH_INFO            1370
    PERFORM DO_TARGET_CHANNEL_LOOKUP (see below)
    Write Prepared Video Viewing Activity Data File 160
  End loop
DO_TARGET_CHANNEL_LOOKUP.
  MOVE 'N' TO TARGET-CHANNEL-FOUND
  MOVE 'N' TO EXCEEDED-MAX-ROWS-IN-ARRAY
PERFORM VARYING SUB
  FROM 1 BY 1
  UNTIL TARGET-CHANNEL-FOUND = 'Y'
  OR EXCEEDED-MAX-ROWS-IN-ARRAY = 'Y'
  IF CHANNEL_INFO 1030 = CHAN-MAP-CHAN-INFO-SOURCE(sub) 1910
  MOVE CHAN-MAP-CHAN-INFO-TARGET(sub) 1920
    TO CHANNEL_INFO_TARGET 1400
  MOVE 'Y' TO TARGET-CHANNEL-FOUND
  END-IF
  IF SUB > 600
   MOVE 'Y' TO EXCEEDED-MAX-ROWS-IN-ARRAY
  END-IF
  END-PERFORM
```

Step 3:
When the Process finishes reading the Video Viewing Activity Data File 130, proceed to Provide File to Downstream Process 210.

Alternative Embodiment

Instead of using a Lookup table as described above, the Channel Information Translation table may be loaded to a database table. In that case the DO_TARGET_CHANNEL_LOOKUP process is done as follows:

```
SELECT TARGET_CHANNEL_INFORMATION_IN 1820
  INTO CHANNEL_INFO_TARGET 1400
FROM CHANNEL INFORMATION TRANSLATION TABLE 142
  WHERE SOURCE_CHANNEL_INFORMATION_IN 1810 = CHANNEL_INFO 1030
```

This completes FIG. 3.

FIG. 4 illustrates an exemplary process for enriching the Video Viewing Activity Data File 130 with any variety of translation data. Whereas FIG. 3 was focused on translating Channel Information, FIG. 4 presents a more generalized solution which enables the analyst to translate, as a Non-limiting example, any of the following fields:
  (i) program information,
  (ii) channel information,
  (iii) house information,
  (iv) device information,
  (v) viewer information,
  (vi) geographic information,
  (vii) demographic information.

I present two alternatives: (a) loading the data translation table from a flat file into the memory of the computer running the Data Translation Processor 154, and (b) performing a join operation using data translation data from a database table.

The process begins with Generalized Enrichment Process Overview 124.

The Data Translation Processor 154 requires several steps:

Step 1:
Load the Data Translation Table as flat file 146 into the memory of the computer in a lookup table. This file can be presented to the Data Translation Processor 154 as a csv file which is then read and loaded to an array in the memory of the computer.
A read loop such as the following can be used to load this table:

```
Move 0 to sub
Execute Read Loop until end of file
Read loop
    Read Data Translation Table as flat file 146
    If end of file
```

```
    exit loop
  Else
    Add 1 to sub
      move TRANSLATION_VALUE_TYPE-IN          2005
        to TRANSLATION_VALUE_TYPE(sub) 2105
      move SOURCE_TRANSLATION_VALUE-IN        2010
        to SOURCE_TRANSLATION_VALUE(sub) 2110
      move TARGET_TRANSLATION_VALUE-IN        2020
        to TARGET_TRANSLATION_VALUE(sub) 2120
    end-if
end loop
```

Step 2:
Accept the various input parameters which will indicate which translations are being done. There is one parameter for each kind of translation which may be done. Each parameter contains a value of 'Y' or 'N' indicating whether or not that field will be translated by the Data Translation Processor 154. The code is as follows:

```
Accept program-information-translation-flag from
    job-run-parm-program-information
Accept channel-information-translation-flag from
    job-run-parm-channel-information
Accept house-information-translation-flag from
    job-run-parm-house-information
Accept device-information-translation-flag from
    job-run-parm-device-information
Accept viewer-information-translation-flag from
    job-run-parm-viewer-information
Accept geographic-information-translation-flag from
    job-run-parm-geographic-information
Accept demographic-information-translation-flag from
    job-run-parm-demographic-information
```

Step 3:

Process the Video Viewing Activity Data File 130 using a read loop as follows:

```
Execute Read Loop until end of file
Read Loop
    Read Video Viewing Activity Data File 130
      If end of file
        exit loop
      Else
        IF program-information-translation-flag = 'Y'
        PERFORM DO TARGET PROGRAM LOOKUP (see below)
        ELSE
          MOVE PROGRAM_INFO              1010 TO PROGRAM_INFO              1210
        END-IF
          MOVE PROGRAM_AIRING_INFO       1020 TO PROGRAM_AIRING_INFO       1220
        IF channel-information-translation-flag = 'Y'
          PERFORM DO TARGET CHANNEL LOOKUP (see below)
        ELSE
          MOVE CHANNEL_INFO              1030 TO CHANNEL_INFO              1230
        END-IF
        IF house-information-translation-flag = 'Y'
          PERFORM DO TARGET HOUSE LOOKUP (see below)
        ELSE
          MOVE HOUSE_INFO                1040 TO HOUSE_INFO                1240
        END-IF
        IF device-information-translation-flag = 'Y'
          PERFORM DO TARGET DEVICE LOOKUP (see below)
        ELSE
          MOVE DEVICE_INFO               1050 TO DEVICE_INFO               1250
        END-IF
        IF viewer-information-translation-flag = 'Y'
          PERFORM DO TARGET VIEWER LOOKUP (see below)
        ELSE
          MOVE VIEWER_INFO               1060 TO VIEWER_INFO               1260
        END-IF
        IF geographic-information-translation-flag = 'Y'
          PERFORM DO TARGET GEOGRAPHIC LOOKUP (see below)
        ELSE
          MOVE GEOGRAPHIC_INFO           1070 TO GEOGRAPHIC_INFO           1270
        END-IF
        IF demographic-information-translation-flag = 'Y'
          PERFORM DO TARGET DEMOGRAPHIC LOOKUP (see below)
        ELSE
          MOVE DEMOGRAPHIC_INFO          1080 TO DEMOGRAPHIC_INFO          1280
        END-IF
          MOVE VIEWING_TYPE              1090 TO VIEWING_TYPE              1290
          MOVE VIEWING_DATE              1100 TO VIEWING_DATE              1300
          MOVE TUNE_IN_DATE_TIME         1102 TO TUNE_IN_DATE_TIME         1302
          MOVE TUNE_IN_SECOND_OF_DAY     1104 TO TUNE_IN_SECOND_OF_DAY     1304
          MOVE TUNE_OUT_DATE_TIME        1106 TO TUNE_OUT_DATE_TIME        1306
          MOVE TUNE_OUT_SECOND_OF_DAY    1108 TO TUNE_OUT_SECOND_OF_DAY    1308
          MOVE PLAYBACK_MODE             1110 TO PLAYBACK_MODE             1310
          MOVE PLAYBACK_BEG_POSITION     1120 TO PLAYBACK_BEG_POSITION     1320
          MOVE PLAYBACK_END_POSITION     1130 TO PLAYBACK_END_POSITION     1330
          MOVE TUNE_DURATION_SECONDS     1138 TO TUNE_DURATION_SECONDS     1338
        MOVE ACTIVITY_DURATION_SECONDS   1140 TO ACTIVITY_DURATION_SECONDS 1340
          MOVE PRESENTATION_INFO         1150 TO PRESENTATION_INFO         1350
          MOVE VIDEO_SERVER_INFO         1160 TO VIDEO_SERVER_INFO         1360
          MOVE SYSTEM_HEALTH_INFO        1170 TO SYSTEM_HEALTH_INFO        1370
```

```
    Write Prepared Video Viewing Activity Data File 160
  End-if
 End loop
DO_TARGET_PROGRAM_LOOKUP.
  MOVE 'N' TO TARGET-PROGRAM-FOUND
  MOVE 'N' TO EXCEEDED-MAX-ROWS-IN-ARRAY
PERFORM VARYING SUB
  FROM 1 BY 1
  UNTIL TARGET-PROGRAM-FOUND = 'Y'
   OR EXCEEDED-MAX-ROWS-IN-ARRAY = 'Y'
   IF TRANSLATION_VALUE_TYPE(sub) 2105 = 'PROGRAM'
    IF PROGRAM_INFO 1010 = SOURCE_TRANSLATION_VALUE(sub) 2110
      MOVE TARGET_TRANSLATION_VALUE(sub) 2120
       TO PROGRAM INFO 1210
      MOVE 'Y' TO TARGET-PROGRAM-FOUND
     END-IF
    END-IF
    IF SUB > 1000
     MOVE 'Y' TO EXCEEDED-MAX-ROWS-IN-ARRAY
     MOVE 'not available' TO PROGRAM_INFO   1210
    END-IF
END-PERFORM
```

Alternative Embodiment

Instead of using a Lookup table as described above, the Data Translation Table may be provided as a database table as shown by Data Translation Table as database Table 148. In that case the DO_TARGET_PROGRAM_LOOKUP process is done as follows:

```
  SELECT TARGET_TRANSLATION_VALUE-IN 2020
     INTO PROGRAM_INFO    1210
     FROM DATA TRANSLATION TABLE 148
       WHERE TRANSLATION_VALUE_TYPE-IN 2005 = 'PROGRAM'
       AND SOURCE_TRANSLATION_VALUE-IN 2010 = PROGRAM_INFO   1010
DO_TARGET_CHANNEL_LOOKUP.
MOVE 'N' TO TARGET-CHANNEL-FOUND
MOVE 'N' TO EXCEEDED-MAX-ROWS-IN-ARRAY
PERFORM VARYING SUB
 FROM 1 BY 1
 UNTIL TARGET-CHANNEL-FOUND = 'Y'
  OR EXCEEDED-MAX-ROWS-IN-ARRAY = 'Y'
  IF TRANSLATION_VALUE_TYPE(sub) 2105 = 'CHANNEL'
   IF CHANNEL_INFO 1030 = SOURCE_TRANSLATION_VALUE(sub) 2110
    MOVE TARGET_TRANSLATION_VALUE(sub) 2120 TO CHANNEL_INFO 1230
    MOVE 'Y' TO TARGET-CHANNEL-FOUND
   END-IF
  END-IF
  IF SUB > 1000
   MOVE 'Y' TO EXCEEDED-MAX-ROWS-IN-ARRAY
   MOVE 'not available' TO CHANNEL_INFO 1230
  END-IF
END-PERFORM
```

Alternative Embodiment

Instead of using a Lookup table as described above, the Data Translation Table may be provided as a database table as shown by Data Translation Table as database Table 148. In that case the DO_TARGET_CHANNEL_LOOKUP process is done as follows:

```
  SELECT TARGET_TRANSLATION_VALUE-IN 2020
     INTO CHANNEL_INFO   1230
    FROM DATA TRANSLATION TABLE 148
      WHERE TRANSLATION_VALUE_TYPE-IN 2005 = 'CHANNEL'
      AND SOURCE_TRANSLATION_VALUE-IN 2010 = CHANNEL_INFO   1030
DO_TARGET_HOUSE_LOOKUP.
 MOVE 'N' TO TARGET-HOUSE-FOUND
 MOVE 'N' TO EXCEEDED-MAX-ROWS-IN-ARRAY
```

-continued

```
PERFORM VARYING SUB
 FROM 1 BY 1
 UNTIL TARGET-HOUSE-FOUND = 'Y'
  OR EXCEEDED-MAX-ROWS-IN-ARRAY = 'Y'
  IF TRANSLATION_VALUE_TYPE(sub) 2105 = 'HOUSE'
   IF HOUSE_INFO 1040 = SOURCE_TRANSLATION_VALUE(sub) 2110
    MOVE TARGET_TRANSLATION_VALUE(sub) 2120 TO HOUSE_INFO 1240
    MOVE 'Y' TO TARGET-HOUSE-FOUND
   END-IF
  END-IF
  IF SUB > 1000
   MOVE 'Y' TO EXCEEDED-MAX-ROWS-IN-ARRAY
   MOVE 'not available' TO HOUSE_INFO 1240
  END-IF
END-PERFORM
```

Alternative Embodiment

Instead of using a Lookup table as described above, the Data Translation Table may be provided as a database table as shown by Data Translation Table as database Table 148. In that case the DO_TARGET_HOUSE_LOOKUP process is done as follows:

```
SELECT TARGET_TRANSLATION_VALUE-IN 2020
   INTO HOUSE_INFO   1240
 FROM DATA TRANSLATION TABLE 148
   WHERE TRANSLATION_VALUE_TYPE-IN 2005 = 'HOUSE'
AND SOURCE_TRANSLATION_VALUE-IN 2010 = HOUSE_INFO   1040
DO_TARGET_DEVICE_LOOKUP.
MOVE 'N' TO TARGET-DEVICE-FOUND
MOVE 'N' TO EXCEEDED-MAX-ROWS-IN-ARRAY
PERFORM VARYING SUB
 FROM 1 BY 1
 UNTIL TARGET-DEVICE-FOUND = 'Y'
  OR EXCEEDED-MAX-ROWS-IN-ARRAY = 'Y'
  IF TRANSLATION_VALUE_TYPE(sub) 2105 = 'DEVICE'
   IF DEVICE_INFO 1050 = SOURCE_TRANSLATION_VALUE(sub) 2110
    MOVE TARGET_TRANSLATION_VALUE(sub) 2120 TO DEVICE_INFO 1250
    MOVE 'Y' TO TARGET-DEVICE-FOUND
   END-IF
  END-IF
  IF SUB > 1000
   MOVE 'Y' TO EXCEEDED-MAX-ROWS-IN-ARRAY
   MOVE 'not available' TO DEVICE_INFO   1250
  END-IF
END-PERFORM
```

Alternative Embodiment

Instead of using a Lookup table as described above, the Data Translation Table may be provided as a database table as shown by Data Translation Table as database Table 148. In that case the DO_TARGET_DEVICE_LOOKUP process is done as follows:

```
SELECT TARGET_TRANSLATION_VALUE-IN 2020
 INTO DEVICE_INFO   1250
   FROM DATA TRANSLATION TABLE 148
 WHERE TRANSLATION_VALUE_TYPE-IN 2005 = 'DEVICE'
  AND SOURCE_TRANSLATION_VALUE-IN 2010 = DEVICE_INFO   1050
DO_TARGET_VIEWER_LOOKUP.
MOVE 'N' TO TARGET-VIEWER-FOUND
MOVE 'N' TO EXCEEDED-MAX-ROWS-IN-ARRAY
PERFORM VARYING SUB
 FROM 1 BY 1
 UNTIL TARGET-VIEWER-FOUND= 'Y'
  OR EXCEEDED-MAX-ROWS-IN-ARRAY= 'Y'
  IF TRANSLATION_VALUE_TYPE(sub) 2105 = 'VIEWER'
   IF VIEWER_INFO 1060 = SOURCE_TRANSLATION_VALUE(sub) 2110
    MOVE TARGET_TRANSLATION_VALUE(sub) 2120 TO VIEWER_INFO 1260
```

```
    MOVE 'Y' TO TARGET-VIEWER-FOUND
  END-IF
 END-IF
 IF SUB > 1000
   MOVE 'Y' TO EXCEEDED-MAX-ROWS-IN-ARRAY
   MOVE 'not available' TO VIEWER_INFO 1260
 END-IF
END-PERFORM
```

Alternative Embodiment

Instead of using a Lookup table as described above, the Data Translation Table may be provided as a database table as shown by Data Translation Table as database Table 148. In that case the DO_TARGET_VIEWER_LOOKUP process is done as follows:

```
SELECT TARGET TRANSLATION VALUE-IN 2020
  INTO VIEWER_INFO  1260
  FROM DATA TRANSLATION TABLE 148
   WHERE TRANSLATION VALUE TYPE-IN 2005 = 'VIEWER'
   AND SOURCE TRANSLATION VALUE-IN 2010 = VIEWER_INFO  1060
DO_TARGET_GEOGRAPHIC_LOOKUP.
MOVE 'N' TO TARGET-GEOGRAPHIC-FOUND
MOVE 'N' TO EXCEEDED-MAX-ROWS-IN-ARRAY
PERFORM VARYING SUB
 FROM 1 BY 1
 UNTIL TARGET-GEOGRAPHIC-FOUND = 'Y'
   OR EXCEEDED-MAX-ROWS-IN-ARRAY= 'Y'
  IF TRANSLATION_VALUE_TYPE(sub) 2105 = 'GEOGRAPHIC'
   IF GEOGRAPHIC_INFO 1070 = SOURCE_TRANSLATION_VALUE(sub) 2110
    MOVE TARGET_TRANSLATION_VALUE(sub) 2120 TO GEOGRAPHIC INFO 1270
    MOVE 'Y' TO TARGET-GEOGRAPHIC-FOUND
   END-IF
  END-IF
  IF SUB > 1000
   MOVE 'Y' TO EXCEEDED-MAX-ROWS-IN-ARRAY
   MOVE 'not available' TO GEOGRAPHIC_INFO 1270
  END-IF
END-PERFORM
```

Alternative Embodiment

Instead of using a Lookup table as described above, the Data Translation Table may be provided as a database table as shown by Data Translation Table as database Table 148. In that case the DO_TARGET_GEOGRAPHIC_LOOKUP process is done as follows:

```
SELECT TARGET_TRANSLATION_VALUE-IN 2020
  INTO GEOGRAPHIC_INFO  1270
  FROM DATA TRANSLATION TABLE 148
   WHERE TRANSLATION_VALUE_TYPE-IN 2005 = 'GEOGRAPHIC'
   AND SOURCE_TRANSLATION_VALUE-IN 2010 = GEOGRAPHIC_INFO  1070
DO_TARGET_DEMOGRAPHIC_LOOKUP.
MOVE 'N' TO TARGET-DEMOGRAPHIC-FOUND
MOVE 'N' TO EXCEEDED-MAX-ROWS-IN-ARRAY
PERFORM VARYING SUB
 FROM 1 BY 1
 UNTIL TARGET-DEMOGRAPHIC-FOUND = 'Y'
   OR EXCEEDED-MAX-ROWS-IN-ARRAY = 'Y'
  IF TRANSLATION_VALUE_TYPE(sub) 2105 = 'DEMOGRAPHIC'
   IF DEMOGRAPHIC_INFO 1080 = SOURCE_TRANSLATION_VALUE(sub) 2110
    MOVE TARGET_TRANSLATION_VALUE(sub) 2120 TO DEMOGRAPHIC_INFO 1280
    MOVE 'Y' TO TARGET-DEMOGRAPHIC-FOUND
   END-IF
  END-IF
  IF SUB > 1000
   MOVE 'Y' TO EXCEEDED-MAX-ROWS-IN-ARRAY
   MOVE 'not available' TO DEMOGRAPHIC_INFO 1280
  END-IF
END-PERFORM
```

Alternative Embodiment

Instead of using a Lookup table as described above, the Data Translation Table may be provided as a database table as shown by Data Translation Table as database Table 148. In that case the DO_TARGET_DEMOGRAPHIC_LOOKUP process is done as follows:

```
SELECT TARGET_TRANSLATION_VALUE-IN 2020
  INTO DEMOGRAPHIC_INFO 1280
FROM DATA TRANSLATION TABLE 148
  WHERE TRANSLATION_VALUE_TYPE-IN 2005 = 'DEMOGRAPHIC'
  AND SOURCE_TRANSLATION_VALUE-IN 2010 = DEMOGRAPHIC_INFO 1080
```

Step 4:

When the Data Translation Processor 154 finishes reading the Video Viewing Activity Data File 130 and enriching each record as needed, proceed to Provide File to Downstream Processes 214.

Note: In each case the Prepared Video Viewing Activity Data File 160 records can be written directly to a distributed file system such as, but not limited to, the Hadoop Distributed File System (HDFS) so that the prepared video viewing activity records are ready for use by downstream processes.

For each of these embodiments, at the completion of Data Translation Processor 154, one record has been written to the Prepared Video Viewing Activity Data File 160 for each record in the input file. In FIG. 8 below I will review various Before and After images to provide examples of inputs and subsequent outputs from the Data Translation Processor 154.

Those skilled in the art will readily recognize that the Data Translation Processor 154 is suitable for running in parallel on multiple computers simultaneously with each process creating Prepared Video Viewing Activity Data File records that can be fed into the downstream processes.

Note: The Video Viewing Activity Data File 130 can be provided to the Data Translation Processor 154 process in any computer readable format including, but not limited to, database tables, flat files, JSON messages, and XML messages. Alternatively, such video viewing events can be collected directly from the source without the need for a Media Measurement Database 100. In such a case, those events can still be provided as video viewing activity in a format similar to that shown in FIG. 5 for use by the Data Translation Processor 154.

This concludes discussion on FIG. 4.

FIG. 5 illustrates an exemplary record layout for a Video Viewing Activity Data File 130 record formatted for use as input to either the Channel Translation Processor 150 or the Data Translation Processor 154, according to one embodiment. There is Summary Information followed by the Data Structure including field definitions.

FIG. 6 illustrates an exemplary record layout for a Channel Information Translation Table 140 or 142 record formatted for use as input to the Channel Translation Processor 150, according to one embodiment. There is Summary Information followed by the Data Structure including field definitions. After the Data Structure there is a set of Sample Data.

FIG. 6 Example 1 shows an example of the data that would be used to translate Standard Definition and High Definition Call Signs to the corresponding Common Call Sign, according to one embodiment. This kind of translation can be used in relation to audience viewership measurement where it is desirable to combine the viewing of standard definition and high definition channels into a single call sign for the applicable channel.

FIG. 6 Example 2 shows an example of the data that would be used to translate selected Standard Definition and High Definition Call Signs to a Common Call Sign, and then translate all the other channel call signs to a common value, according to one embodiment. This kind of translation can be used in relation to audience viewership measurement where it is desirable to combine the viewing of standard definition and high definition channels into a single call sign for the applicable channel with the objective of simply measuring viewing of that specific channel, either by itself or as a percentage of the overall viewing that is occurring during the measurement window. By reducing the number of target channels to a single value for all of the channels that are not of interest in the analysis, the aggregation run time can be reduced substantially and the computer resource usage can be reduced as well.

Those skilled in the art will be able to create various combinations of the mappings to meet any number of analytical needs.

FIG. 7 illustrates an exemplary data structure for a Channel Mapping Definition Array Data Structure which may be used by the Channel Translation Processor 150, according to one embodiment. There is Summary Information followed by the Data Structure including field definitions.

The process for loading the file in FIG. 6 to the Array in FIG. 7 is described in FIG. 3 Step 1.

FIG. 8 illustrates an exemplary record layout for a Data Translation Table 146 or 148 record formatted for use as input to the Data Translation Processor 154, according to one embodiment. There is Summary Information followed by the Data Structure including field definitions. After the Data Structure there is a set of Sample Data.

FIG. 8 Example 1 relates to translating PROGRAM information, according to one embodiment. This figure shows an example of the data that would be used to translate program type. This non-limiting example shows keeping the type of "SPORT" unchanged while replacing the other values with a value of "OTHER". This kind of translation can be used in relation to audience viewership measurement where the analyst needs to compare viewing of one kind of program with all the other viewing that is happening concurrently.

FIG. 8 Example 2 shows an example of the data that would be used to translate Standard Definition and High Definition Call Signs to a Common Call Sign, according to one embodiment. This kind of translation can be used in relation to audience viewership measurement where it is desirable to combine the viewing of standard definition and high definition channels into a single call sign for the applicable channel.

FIG. 8 Example 3 shows an example of the data that would be used to translate selected Standard Definition and High Definition Call Signs to a Common Call Sign, and then translate all the other channel call signs to a common value, according to one embodiment. This kind of translation can be used in relation to audience viewership measurement where it is desirable to combine the viewing of standard definition and high definition channels into a single call sign for the applicable channel with the objective of simply measuring that specific channel. By reducing the number of target channels to a single value for all of the channels that are not of interest in the analysis, the aggregation run time can be reduced substantially and the computer resources can be reduced as well.

FIG. 8 Example 4 relates to translating HOUSE information, according to one embodiment. This figure shows an example of the data that would be used to translate house type. This non-limiting example shows keeping the type of "HOUSE" unchanged while replacing the other values (APT, OFFICE, SCHOOL) with a value of "OTHER". This kind of translation can be used in relation to audience viewership measurement where the analyst needs to compare viewing of one kind of house with all the other viewing that is happening concurrently (HOUSE viewing vs. combined viewing by APT, OFFICE, and SCHOOL).

FIG. 8 Example 5 relates to translating DEVICE information, according to one embodiment. This figure shows an example of the data that would be used to translate device type. This non-limiting example shows keeping the type of "STB" unchanged while replacing the other values (IPTV, TABLET, PHONE) with a value of "OTHER". This kind of translation can be used in relation to audience viewership measurement where the analyst needs to compare viewing of one kind of device with all the other viewing that is happening concurrently (STB viewing vs. combined viewing by IPTV, TABLET, and PHONE).

FIG. 8 Example 6 relates to translating VIEWER information, according to one embodiment. This figure shows an example of the data that would be used to translate viewer type. This non-limiting example shows keeping the type of "PARENT" unchanged while replacing the other values (CHILD, STUDENT) with a value of "OTHER". This kind of translation can be used in relation to audience viewership measurement where the analyst needs to compare viewing of one kind of viewer with all the other viewing that is happening concurrently (PARENT viewing vs. combined viewing by CHILD and STUDENT).

FIG. 8 Example 7 relates to translating GEOGRAPHIC information, according to one embodiment. This figure shows an example of the data that would be used to translate geographic information. This non-limiting example shows translating from a more detailed view to a higher view. Thus each of the detailed zip codes values is replaced by a value with only the first three digits of the zip code followed by XX. This kind of translation can be used in relation to audience viewership measurement where the analyst needs to aggregated the viewing of the individual zip codes to a higher level code.

FIG. 8 Example 8 relates to translating DEMOGRAPHIC information, according to one embodiment. This figure shows an example of the data that would be used to translate demographic information. This non-limiting example shows translating from a more detailed view which lists age ranges of children and adults to a higher view which simply lists CHILD and ADULT. Thus each of the detailed age range values for children is replaced by the value "CHILD" and the adult age ranges are replaced by "ADULT". This kind of translation can be used in relation to audience viewership measurement where the analyst needs to aggregate the viewing of the various age ranges to a more general value.

FIG. 8 Summary
Each of the above non-limiting examples shows translating a more detailed value to a less detailed value. By reducing the number of distinct values to be used in the aggregation process, the aggregation run time can be reduced substantially and the computer resource usage can be reduced as well.

Those skilled in the art will be able to create various combinations of the mappings to meet any number of analytical needs.

FIG. 9 illustrates an exemplary data structure for a Generalized Mapping Definition Array Data Structure which may be used by the Data Translation Processor 154, according to one embodiment. There is Summary Information followed by the Data Structure including field definitions.

The process for loading the file in FIG. 8 to the Array in FIG. 9 is described in FIG. 4 Step 1.

FIG. 10 illustrates various non-limiting examples which provide 'Before' and 'After' images of Linear Tuning Activity (LTA) records to illustrate what the Channel Translation Processor 150 and Data Translation Processor 154 do, according to one embodiment.

FIG. 10 Example 1 relates to translating GEOGRAPHIC information, according to one embodiment. The "Before" shows Video Viewing Activity Data File 130 records with detailed Geographic Id's (Zip codes)—reference field 1070.

The "After" shows Prepared Video Viewing Activity Data File 160 records with detailed Geographic Id's (Zip codes) replaced by a higher level code—reference field 1270.

FIG. 10 Example 2 relates to translating CHANNEL information, according to one embodiment. The "Before" shows Video Viewing Activity Data File 130 records with both Standard Definition and High Definition Call Signs—reference field 1030.

The "After" shows Prepared Video Viewing Activity Data File 160 records with detailed call signs replaced by Common Call Signs—reference field 1230.

FIG. 10 Example 3 relates to translating CHANNEL information, according to one embodiment. The "Before" shows Video Program Viewing Activity Data File 130 records with both Standard Definition and High Definition Call Signs and other call signs for the various channels—reference field 1030.

The "After" shows Prepared Video Program Viewing Activity Data File 160 records with the Standard Definition and High Definition Call Signs mapped to a common value for the channel of interest (HIST) and the other call signs mapped to "OTHER"—reference field 1230.

FIG. 10 Example 4 relates to translating VIEWING DEVICE information, according to one embodiment. The "Before" shows Video Viewing Activity Data File 130 records with various kinds of viewing devices (STB, IPTV, TABLET, PHONE)—reference field 1050.

The "After" shows Prepared Video Viewing Activity Data File 160 records with the device type of "STB" unchanged while IPTV, TABLET, PHONE have been mapped to "OTHER"—reference field 1250.

FIG. 10 Example 5 relates to translating HOUSE information, according to one embodiment. The "Before" shows Video Viewing Activity Data File 130 records with various kinds of house information values (HOUSE, APT, OFFICE, SCHOOL)—reference field 1040.

The "After" shows Prepared Video Viewing Activity Data File 160 records with the house information type of "HOUSE" unchanged while APT, OFFICE, and SCHOOL have been mapped to "OTHER"—reference field 1240.

FIG. 10 Example 6 relates to translating VIEWER information, according to one embodiment. The "Before" shows Video Viewing Activity Data File 130 records with various kinds of viewer information values (PARENT, CHILD, STUDENT)—reference field 1060.

The "After" shows Prepared Video Viewing Activity Data File 160 records with the viewer information type of "PARENT" unchanged while CHILD and STUDENT have been mapped to "OTHER"—reference field 1260.

FIG. 10 Example 7 relates to translating DEMOGRAPHIC information, according to one embodiment. The "Before" shows Video Viewing Activity Data File 130 records with various kinds of demographic values (1-3 YR, 4-5 YR, 6-8 YR, 21-44 YR, 45-54 YR)—reference field 1080. The "After" shows Prepared Video Viewing Activity Data File 160 records with the demographic values mapped to new, summary values (1-3 YR, 4-5 YR, 6-8 YR mapped to "CHILD" and 21-44 YR, 45-54 YR mapped to "PARENT")—reference field 1280.

FIG. 11 illustrates various non-limiting examples which provide 'Before' and 'After' images of Linear Viewing Activity (LVA), Digital Video Recorder viewing activity (DVR), Video On Demand viewing activity (VOD), Educational viewing (EDU), and Live viewing activity (LIV) records to illustrate what the Channel Translation Processor 150 and Data Translation Processor 154 do, according to one embodiment.

FIG. 11 Example 1 relates to translating PROGRAM information, according to one embodiment. The "Before" shows Video Viewing Activity Data File 130 records with a variety of Program information values (SPORT, DOCU, NATU, NEWS)—reference field 1010.

The "After" shows Prepared Video Viewing Activity Data File 160 records with only two values (SPORT and OTHER) with the values of DOCU, NATU, NEWS having been replaced by OTHER—reference field 1210. Thus a more detailed value has been replaced by a summary value.

FIG. 11 Example 2 relates to translating CHANNEL information, according to one embodiment. The "Before" shows Video Viewing Activity Data File 130 records with both Standard Definition and High Definition Call Signs—reference field 1030.

The "After" shows Prepared Video Viewing Activity Data File 160 records with detailed call signs replaced by Common Call Signs—reference field 1230.

FIG. 11 Example 3 relates to translating CHANNEL information, according to one embodiment. The "Before" shows Video Viewing Activity Data File 130 records with both Standard Definition and High Definition Call Signs and other call signs for the various channels—reference field 1030.

The "After" shows Prepared Video Viewing Activity Data File 160 records with the Standard Definition and High Definition Call Signs mapped to a common value for the channel of interest (HIST) and the other call signs mapped to "OTHER"—reference field 1230.

FIG. 11 Example 4 relates to translating HOUSE information, according to one embodiment. The "Before" shows Video Viewing Activity Data File 130 records with various kinds of house information values (HOUSE, APT, OFFICE, SCHOOL)—reference field 1040.

The "After" shows Prepared Video Viewing Activity Data File 160 records with the house information type of "HOUSE" unchanged while APT, OFFICE, and SCHOOL have been mapped to "OTHER"—reference field 1240.

FIG. 11 Example 5 relates to translating VIEWING DEVICE information, according to one embodiment. The "Before" shows Video Viewing Activity Data File 130 records with various kinds of viewing devices (STB, IPTV, TABLET, PHONE)—reference field 1050.

The "After" shows Prepared Video Viewing Activity Data File 160 records with the device type of "STB" unchanged while IPTV, TABLET, PHONE have been mapped to "OTHER"—reference field 1250.

FIG. 11 Example 6 relates to translating VIEWER information, according to one embodiment. The "Before" shows Video Viewing Activity Data File 130 records with various kinds of viewer information values (PARENT, CHILD, STUDENT)—reference field 1060.

The "After" shows Prepared Video Viewing Activity Data File 160 records with the viewer information type of "PARENT" unchanged while CHILD and STUDENT have been mapped to "OTHER"—reference field 1260.

FIG. 11 Example 7 relates to translating GEOGRAPHIC information, according to one embodiment. The "Before" shows Video Viewing Activity Data File 130 records with detailed Geographic Id's (Zip codes)—reference field 1070.

The "After" shows Prepared Video Viewing Activity Data File 160 records with detailed Geographic Id's (Zip codes) replaced by a higher level code—reference field 1270.

FIG. 11 Example 8 relates to translating DEMOGRAPHIC information, according to one embodiment. The "Before" shows Video Viewing Activity Data File 130 records with various kinds of demographic values (1-3 YR, 4-5 YR, 6-8 YR, 21-44 YR, 45-54 YR)—reference field 1080. The "After" shows Prepared Video Viewing Activity Data File 160 records with the demographic values mapped to new, summary values (1-3 YR, 4-5 YR, 6-8 YR mapped to "CHILD" and 21-44 YR, 45-54 YR mapped to "PARENT")—reference field 1280.

FIG. 11 Summary

Each of the above non-limiting examples shows translating a more detailed value to a less detailed value. By reducing the number of distinct values to be used in the aggregation process, the aggregation run time can be reduced substantially and the computer resource usage can be reduced as well.

FIG. 12 illustrates an exemplary record layout for a Prepared Video Viewing Activity Data File 160 record created by either the Channel Translation Processor 150 or the Data Translation Processor 154, according to one embodiment. There is Summary Information followed by the Data Structure including field definitions.

Alternative Embodiments

Although the description above contains much specificity, this should not be construed as limiting the scope of the embodiments but as merely providing illustrations of some of several embodiments. As a nonlimiting example, additional qualifiers may be added along with those provided.

Scope of Viewer Interaction Data Loaded

I presently contemplate that the Channel Translation Processor 150 and Data Translation Processor 154 will each process viewer interaction data for whatever set of viewing activity is provided to it. This may be one Video Program at a time, one hour of the day, a primetime television viewing period, an entire 24 hour day of viewing, a week of viewing, a weekly program schedule time slot, or another time period decided by the analyst. Another embodiment may simply process viewing activity within the context of a single program, or a single advertisement, or some other combination.

Identifiers for Data

I presently contemplate using a combination of numeric and mnemonics for the various fields such as program info, program airing info, channel info, house info, device info, viewer info, geographic info, demographic info, viewing type, video server identifiers, system health info, and other similar fields, but another embodiment could use only numeric values as identifiers with links to reference tables for the descriptions of the numeric identifiers or only mnemonic identifiers.

Programming Algorithm Scope

I presently contemplate executing the algorithms described herein separately in some sequence, but another embodiment could combine multiple simple algorithms into fewer complex algorithms.

Receiving Date and Time Information

I presently contemplate receiving all of the date and time values in local time, but another embodiment may provide these in Coordinated Universal Time (UTC time).

General Information

I presently contemplate using variables having the data types and field sizes shown, but another embodiment may use variables with different data types and field sizes to accomplish a similar result.

I presently contemplate using record layouts similar to those defined herein, but another embodiment may use a different record layout or record layouts to accomplish a similar result. As a nonlimiting example, another embodiment may use database tables or other objects instead of record layouts similar to those I have defined herein to accomplish a similar result while still working within the spirit and scope of this disclosure.

Implementation Information

I presently contemplate using Linux operating system, but another embodiment may use a different operating system.

I presently contemplate using the COBOL language, but another embodiment may use Java or Python or some other language.

General Remarks

It will be apparent to those of ordinary skill in the art that various changes and modifications may be made which clearly fall within the scope of the embodiments revealed herein. In describing an embodiment illustrated in the drawings, specific terminology has been used for the sake of clarity. However, the embodiments are not intended to be limited to the specific terms so selected, and it is to be understood that each specific term includes all technical equivalents which operate in a similar manner to accomplish a similar purpose.

In general, it will be apparent to one of ordinary skill in the art that various embodiments described herein, or components or parts thereof, may be implemented in many different embodiments of software, firmware, and/or hardware, or modules thereof. The software code or specialized control hardware used to implement some of the present embodiments is not limiting of the present embodiment. For example, the embodiments described hereinabove may be implemented in computer software using any suitable computer software language type such as, for example, Python or JAVA or COBOL using, for example, conventional or object-oriented techniques. Such software may be stored on any type of suitable computer-readable medium or media such as, for example, a magnetic or optical storage medium. Thus, the operation and behavior of the embodiments are described in COBOL language purely as a matter of convenience. It is clearly understood that artisans of ordinary skill would be able to design software and control hardware to implement the embodiments presented in the language of their choice based on the description herein with only a reasonable effort and without undue experimentation.

The processes associated with the present embodiments may be executed by programmable equipment, such as computers. Software or other sets of instructions that may be employed to cause programmable equipment to execute the processes may be stored in any storage device, such as, for example, a computer system (non-volatile) memory, a compact disk, an optical disk, magnetic tape, or magnetic disk. Furthermore, some of the processes may be programmed when the computer system is manufactured or via a computer-readable medium.

It can also be appreciated that certain process aspects disclosed herein may be performed using instructions stored on a computer-readable memory medium or media that direct a computer or computer system to perform process steps. A computer-readable medium may include, for example, memory devices such as diskettes, compact discs of both read-only and read/write varieties, optical disk drives, memory sticks, and hard disk drives. A computer-readable medium may also include memory storage that may be physical, virtual, permanent, temporary, semi-permanent and/or semi-temporary.

In various embodiments disclosed herein, a single component or algorithm may be replaced by multiple components or algorithms, and multiple components or algorithms may be replaced by a single component or algorithm, to perform a given function or functions. Except where such substitution would not be operative to implement the embodiments disclosed herein, such substitution is within the scope presented herein. Thus any element expressed herein as a means or a method for performing a specified function is intended to encompass any way of performing that function including, for example, a combination of elements that performs that function. Therefore, any means or method that can provide such functionalities may be considered equivalents to the means or methods shown herein.

It can be appreciated that the "data analysis computer system" may be, for example, any computer system capable of running the Translator Processors described herein, whether it be a one node system or a system with thousands of nodes. In an alternative embodiment, it may be a relational database server.

While various embodiments have been described herein, it should be apparent, however, that various modifications, alterations and adaptations to those embodiments may occur to persons skilled in the art with the attainment of some or all of the advantages described herein. The disclosed embodiments are therefore intended to include all such modifications, alterations and adaptations without departing from the scope and spirit of the embodiments presented herein as set forth in the appended claims.

Accordingly, the scope should be determined not by the embodiments illustrated, but by the appended claims and their legal equivalents.

CONCLUSIONS, RAMIFICATIONS, AND SCOPE

From the description above, a number of advantages of some embodiments of my Channel Translation Processor 150 and Data Translation Processor 154 and its supporting processes become evident:

In this specification I have taught how to reduce the workload on the Hadoop MapReduce framework by translating various values from detailed values to summary values prior to sending the data files to the downstream processes. By implementing the teachings described in this specification, an analyst can reduce the number of unique keys going into the Reduce part of the MapReduce process by 2, 5, 10, and even 100 times. This huge reduction in the unique keys results in a significant reduction in run time and computing resources needed to run the analytical study. This allows an analyst to get answers faster and to run additional analytical studies with the same or less computer hardware.

Additionally, by teaching how to translate multiple kinds of values (program information, channel information, house information, device information, viewer information, geographic information, demographic information) in a single program run, the analyst can create studies which combine multiple dimensions in one run thus being able to slice-and-dice the data in numerous ways to understand how different content is consumed. This provides a framework for creating business value through in-depth analytics.

Also, by implementing my teaching, an analyst can avoid additional expensive database extracts which may otherwise be needed to create the alternative versions of the video viewing activity files which could be fed into downstream processes.

Once the data translations are applied, the resulting prepared file is ready to be used by down-stream processes.

This method of translating various detailed values to summary values prior to feeding the Video Viewing Activity Data files into the downstream processes is a novel technique that has not been taught previously. Using this technique I am able to analyze larger data sets using less hardware than was possible previously.

Summary

In accordance with one embodiment, I have disclosed a computer-implemented method of using Linear, DVR, VOD, and streaming video viewing activity data as input to a data translation processor which prepares that video viewing activity for more efficient downstream processing by translating detailed values to aggregated values according to analyst defined translation rules in preparation for ingestion by a MapReduce Framework with the result that the MapReduce Framework needs to process less data in order to create analytical studies of second-by-second viewing activity for program, channel, house, device, viewer, demographic, and geographic attributes. The source data may be extracted from a database defined according to the Cable Television Laboratories, Inc. Media Measurement Data Model defined in "Audience Data Measurement Specification" as "OpenCable™ Specifications, Audience Measurement, Audience Measurement Data Specification" document OC-SP-AMD-I01-130502 or any similar format. An analyst can use Hadoop to run more studies in less time with less hardware thus gaining greater insights into viewing activity at lower cost.

What is claimed:

1. A method comprising:
   determining, by a computing system and based on video-viewing-activity data received from a plurality of video-asset-viewing devices, an attribute for each of the plurality of video-asset-viewing devices;
   replacing an attribute associated with a first video-asset-viewing device of the plurality of video-asset-viewing devices and a different attribute associated with a second video-asset-viewing device of the plurality of video-asset-viewing devices with a common substitute value; and
   based on a first plurality of time intervals during which the first video-asset-viewing device outputted a video asset and a second plurality of time intervals during which the second video-asset-viewing device outputted the video asset, determining a video-viewing-activity metric associated with the common substitute value.

2. The method of claim 1, wherein the video asset comprises an advertisement.

3. The method of claim 1, further comprising:
   determining a mapping of a plurality of attributes to the common substitute value.

4. The method of claim 1, wherein the attribute associated with the first video-asset-viewing device, the different attribute associated with the second video-asset-viewing device, and the common substitute value are associated with a same type of attribute of a plurality of types of attributes.

5. The method of claim 4, wherein the plurality of types of attributes comprise two or more of a video-content-description type of attribute, a viewer-geographic-location type of attribute, a viewer-demographic type of attribute, or a video-asset-viewing-device-characteristic type of attribute.

6. The method of claim 1, wherein the common substitute value comprises a shortened version of the attribute associated with the first video-asset-viewing device and the different attribute associated with the second video-asset-viewing device.

7. The method of claim 1, wherein the common substitute value comprises a descriptor describing the attribute associated with the first video-asset-viewing device and the different attribute associated with the second video-asset-viewing device.

8. The method of claim 1, further comprising:
   associating each time interval of the first plurality of time intervals with the common substitute value.

9. The method of claim 1, wherein the attribute associated with the first video-asset-viewing device comprises a textual value, and wherein the common substitute value comprises a different textual value.

10. The method of claim 1, further comprising:
    associating each time interval of the first plurality of time intervals with an indication of a computing device that sends the video asset to the plurality of video-asset-viewing devices; and
    associating each time interval of the second plurality of time intervals with an indication of the computing device.

11. The method of claim 1, wherein the replacing the attribute and the different attribute is based on determining that the attribute associated with the first video-asset-viewing device and the different attribute associated with the second video-asset-viewing device satisfy a mapping of attributes to target values.

12. The method of claim 1, further comprising:
    receiving, for a data-translation table, one or more user-defined parameters comprising the attribute associated with the first video-asset-viewing device, the different attribute associated with the second video-asset-viewing device, and the common substitute value; and
    generating, by the computing system and based on the one or more user-defined parameters, the data-translation table.

13. An apparatus comprising:
    one or more processors;
    memory storing instructions that, when executed by the one or more processors, cause the apparatus to:
        determine, based on video-viewing-activity data received from a plurality of video-asset-viewing devices, an attribute for each of the plurality of video-asset-viewing devices;

replace an attribute associated with a first video-asset-viewing device of the plurality of video-asset-viewing devices and a different attribute associated with a second video-asset-viewing device of the plurality of video-asset-viewing devices with a common substitute value; and based on a first plurality of time intervals during which the first video-asset-viewing device outputted a video asset and a second plurality of time intervals during which the second video-asset-viewing device outputted the video asset, determine a video-viewing-activity metric associated with the common substitute value.

14. The apparatus of claim 13, wherein the video asset comprises an advertisement.

15. The apparatus of claim 13, wherein the instructions, when executed by the one or more processors, further cause the apparatus to:

determine a mapping of a plurality of attributes to the common substitute value.

16. The apparatus of claim 13, wherein the common substitute value comprises a shortened version of the attribute associated with the first video-asset-viewing device and the different attribute associated with the second video-asset-viewing device.

17. The apparatus of claim 13, wherein the common substitute value comprises a descriptor describing the attribute associated with the first video-asset-viewing device and the different attribute associated with the second video-asset-viewing device.

18. The apparatus of claim 13, wherein the instructions, when executed by the one or more processors, further cause the apparatus to:

associate each time interval of the first plurality of time intervals with the common substitute value.

19. The apparatus of claim 13, wherein the instructions, when executed by the one or more processors, further cause the apparatus to:

associate each time interval of the first plurality of time intervals with an indication of a computing device that sends the video asset to the plurality of video-asset-viewing devices.

20. The apparatus of claim 13, wherein the instructions, when executed by the one or more processors, further cause the apparatus to replace the attribute and the different attribute based on determining that the attribute associated with the first video-asset-viewing device and the different attribute associated with the second video-asset-viewing device satisfy a mapping of attributes to target values.

21. The apparatus of claim 13, wherein the instructions, when executed by the one or more processors, further cause the apparatus to:

receive, for a data-translation table, one or more user-defined parameters comprising the attribute associated with the first video-asset-viewing device, the different attribute associated with the second video-asset-viewing device, and the common substitute value; and generate, based on the one or more user-defined parameters, the data-translation table.

22. A system comprising:
a computing device comprising:
one or more first processors; and
memory storing instructions that, when executed by the one or more first processors, cause the computing device to:
determine, based on video-viewing-activity data received from a plurality of video-asset-viewing devices, an attribute for each of the plurality of video-asset-viewing devices;

replace an attribute associated with a first video-asset-viewing device of the plurality of video-asset-viewing devices and a different attribute associated with a second video-asset-viewing device of the plurality of video-asset-viewing devices with a common substitute value; and based on a first plurality of time intervals during which the first video-asset-viewing device outputted a video asset and a second plurality of time intervals during which the second video-asset-viewing device outputted the video asset, determine a video-viewing-activity metric associated with the common substitute value; and a video-asset-viewing device comprising:
one or more second processors; and
memory storing instructions that, when executed by the one or more second processors, cause the video-asset-viewing device to send at least a portion of the video-viewing-activity data.

23. The system of claim 22, wherein the video asset comprises an advertisement.

24. The system of claim 22, wherein the instructions stored in the memory of the computing device, when executed by the one or more first processors of the computing device, further cause the computing device to:

determine a mapping of a plurality of attributes to the common substitute value.

25. The system of claim 22, wherein the instructions stored in the memory of the computing device, when executed by the one or more first processors of the computing device, further cause the computing device to:

associate each time interval of the first plurality of time intervals with the common substitute value.

26. The system of claim 22, wherein the instructions stored in the memory of the computing device, when executed by the one or more first processors of the computing device, further cause the computing device to:

associate each time interval of the first plurality of time intervals with an indication of a computing device that sends the video asset to the plurality of video-asset-viewing devices; and associate each time interval of the second plurality of time intervals with an indication of the computing device.

27. The system of claim 22, wherein the instructions stored in the memory of the computing device, when executed by the one or more first processors of the computing device, further cause the computing device to replace the attribute and the different attribute based on determining that the attribute associated with the first video-asset-viewing device and the different attribute associated with the second video-asset-viewing device satisfy a mapping of attributes to target values.

28. The system of claim 22, wherein the instructions stored in the memory of the computing device, when executed by the one or more first processors of the computing device, further cause the computing device to:

receive, for a data-translation table, one or more user-defined parameters comprising the attribute associated with the first video-asset-viewing device, the different attribute associated with the second video-asset-viewing device, and the common substitute value; and generate, based on the one or more user-defined parameters, the data-translation table.

29. One or more non-transitory computer readable media storing instructions that, when executed cause:

determining, based on video-viewing-activity data received from a plurality of video-asset-viewing devices, an attribute for each of the plurality of video-asset-viewing devices;

replacing an attribute associated with a first video-asset-viewing device of the plurality of video-asset-viewing devices and a different attribute associated with a second video-asset-viewing device of the plurality of video-asset-viewing devices with a common substitute value; and based on a first plurality of time intervals during which the first video-asset-viewing device outputted a video asset and a second plurality of time intervals during which the second video-asset-viewing device outputted the video asset, determining a video-viewing-activity metric associated with the common substitute value.

30. The one or more non-transitory computer readable media of claim 29, wherein the video asset comprises an advertisement.

31. The one or more non-transitory computer readable media of claim 29, wherein the instructions, when executed, further cause:

determining a mapping of a plurality of attributes to the common substitute value.

32. The one or more non-transitory computer readable media of claim 29, wherein the instructions, when executed, further cause:

associating each time interval of the first plurality of time intervals with the common substitute value.

33. The one or more non-transitory computer readable media of claim 29, wherein the instructions, when executed, further cause:

associating each time interval of the first plurality of time intervals with an indication of a computing device that sends the video asset to the plurality of video-asset-viewing devices; and associating each time interval of the second plurality of time intervals with an indication of the computing device.

34. The one or more non-transitory computer readable media of claim 29, wherein the instructions, when executed, further cause replacing the attribute and the different attribute based on determining that the attribute associated with the first video-asset-viewing device and the different attribute associated with the second video-asset-viewing device satisfy a mapping of attributes to target values.

35. The one or more non-transitory computer readable media of claim 29, wherein the instructions, when executed, further cause:

receiving, for a data-translation table, one or more user-defined parameters comprising the attribute associated with the first video-asset-viewing device, the different attribute associated with the second video-asset-viewing device, and the common substitute value; and generating, based on the one or more user-defined parameters, the data-translation table.

* * * * *